United States Patent [19]

Waechter et al.

[11] Patent Number: 4,550,381
[45] Date of Patent: Oct. 29, 1985

[54] SPECTROMETER GUN

[75] Inventors: David A. Waechter; Michael A. Wolf; C. John Umbarger, all of Los Alamos, N. Mex.

[73] Assignee: The United States of America as represented by the United States Department of Energy, Washington, D.C.

[21] Appl. No.: 317,816

[22] Filed: Nov. 3, 1981

[51] Int. Cl.[4] ............................................. G06F 15/52
[52] U.S. Cl. .................................. 364/527; 250/369; 364/524
[58] Field of Search ............... 364/498, 524, 525, 527; 250/369, 388

[56] References Cited

U.S. PATENT DOCUMENTS 4,228,512  10/1980  Thompson et al. ................ 364/527

OTHER PUBLICATIONS

Wolf et al., "A New Ultra Small Battery Operated Portable Multi-Channel Analyzer", IEEE[3] Transactions on Nuclear Science, vol. NS-27, No. 1, Feb. 1980, pp. 322-325.

Wolf, "Portable Survey Instrument for Low Levels of Transuranic Contaminants", LA-6860-MS, Jul. 1977.
Wolf et al, "Use of a Cadmium Telluride Detector in a New Tiny Personal Radiation Chirper", IEEE Transactions on Nuclear Science, vol. NS-26, No. 1, Feb. 1979.
Waechter et al, "Hand-Held Gamma-Ray Spectrometer Gun", IEEE Transactions on Nuclear Science, vol. NS-28, No. 1, Feb. 1981.
Umbarger et al, "A Battery Operated Portable Phoswich Detector for Field Monitoring of Low Levels of Transuranic Contaminants", Nuclear Instruments and Methods, 155, 1978, pp. 453-457.

Primary Examiner—Errol A. Krass
Assistant Examiner—Edward R. Cosimano
Attorney, Agent, or Firm—Leonard C. Brenner; Paul D. Gaetjens; Judson R. Hightower

[57] ABSTRACT

A hand-holdable, battery-operated, microprocessor-based spectrometer gun includes a low-power matrix display and sufficient memory to permit both real-time observation and extended analysis of detected radiation pulses. Universality of the incorporated signal processing circuitry permits operation with various detectors having differing pulse detection and sensitivity parameters.

5 Claims, 36 Drawing Figures

4,550,381

SPECTROMETER GUN

BACKGROUND OF THE INVENTION

This invention is the result of a contract with the Department of Energy (Contract No. W-7405-ENG-36).

The present invention relates generally to the development of spectrometers and more particularly to the development of a portable battery operated spectrometer for use in the field to acquire data sufficient for qualitative analysis and identification of various radiation sources such as gamma ray and the like.

It is appreciated that a portable battery operated hand-holdable spectrometer gun would be of great benefit in the fields of health physics, nuclear waste management, mineral prospecting, nuclear safeguards, and other similar fields. Conventional spectrometers with CRT readouts and high power consumption components requiring large battery supplies leave much to be desired for true field utility. For example, a recently developed portable radiation detector for field monitoring took two embodiments; a first single unit embodiment for short term observation only and a second "field" unit having a backpack battery power supply, a meter and instrumentation unit strapped to the operator's chest, and a hand held detector unit, see C. J. Umbarger and M. A. Wolf, Nucl. Instr. and Meth. 155(1978) 454.

Therefore it is an object of the present invention to provide a truly portable spectrometer instrument easily carried and operated in the field for extended periods of time.

It is another object of the present invention to provide a complete portable spectrometer instrument having data gathering, data processing, data storage, and data display capabilities.

It is still another object of the present invention to provide an integrated spectrometer instrument having power source, detector, electronics, display, and controls contained within a single hand-holdable package.

SUMMARY OF THE INVENTION

To achieve the foregoing and other objects, and in accordance with the purposes of the present invention, as embodied and broadly described herein, the apparatus of this invention may comprise a detector section, having a radiation detector, a photomultiplier tube and a high voltage power supply, an input processing section having amplifiers, signal processing circuitry and an A/D converter, a digital processing section having a microprocessor with control and data memories, a display section having an LCD data matrix display and an alphanumeric LCD mode-of-operation display, a control section having a keyboard and other switches to control display and other functions and a battery section. Preferably CMOS and other low power circuitry is used with Ni-Cds batteries packaged together in a light hand-holdable single package for extended field application.

One advantage of the present invention is that its utilization of CMOS components, digital circuitry, and LCD displays permit extended field operation with a small rechargeable battery supply.

Another advantage of the present invention is that its pulse amplification and digital storage and display circuitry may be used with a diversity of detectors to monitor a variety of gamma and other radiation pulses.

Still another advantage of the present invention is that its microprocessor's data memory permits extended analysis as well as real-time monitoring of detected radiation pulses.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

| GLOSSARY OF ABBREVIATIONS AND ACRONYMS | |
|---|---|
| A/H | Mode Line. "Acquire" when high and "Hold" when low |
| CSTB | Character Strobe. Load pulse for Alphanumeric Display Logic |
| D0-D7 | Data. Eight bit parallel |
| DMA0 | DMA output request to CPU (microprocessor) |
| DMARES | Reset pulse for the flip-flop which generates DMA |
| DMLOAD | Load pulse in response to DMA output request |
| EF1 | Flag line signifying that an input has been received by the input circuits |
| EF2 | Flag line signifying that the DMA count logic needs servicing |
| INT | Interrupt Line for CPU |
| N0 | I/O line 0 from CPU |
| N1 | I/O line 1 from CPU |
| N2 | I/O line 2 from CPU |
| PCLR | Power-on reset |
| Q | CPU output flip-flop |
| RLCD$\theta$ | Phase clock generated by 32 × 32 column driver |
| TPB | Timing pulse "B" of CPU |

DETAILED DESCRIPTION OF THE PREFERRED EMBODIMENT

Figure 1:
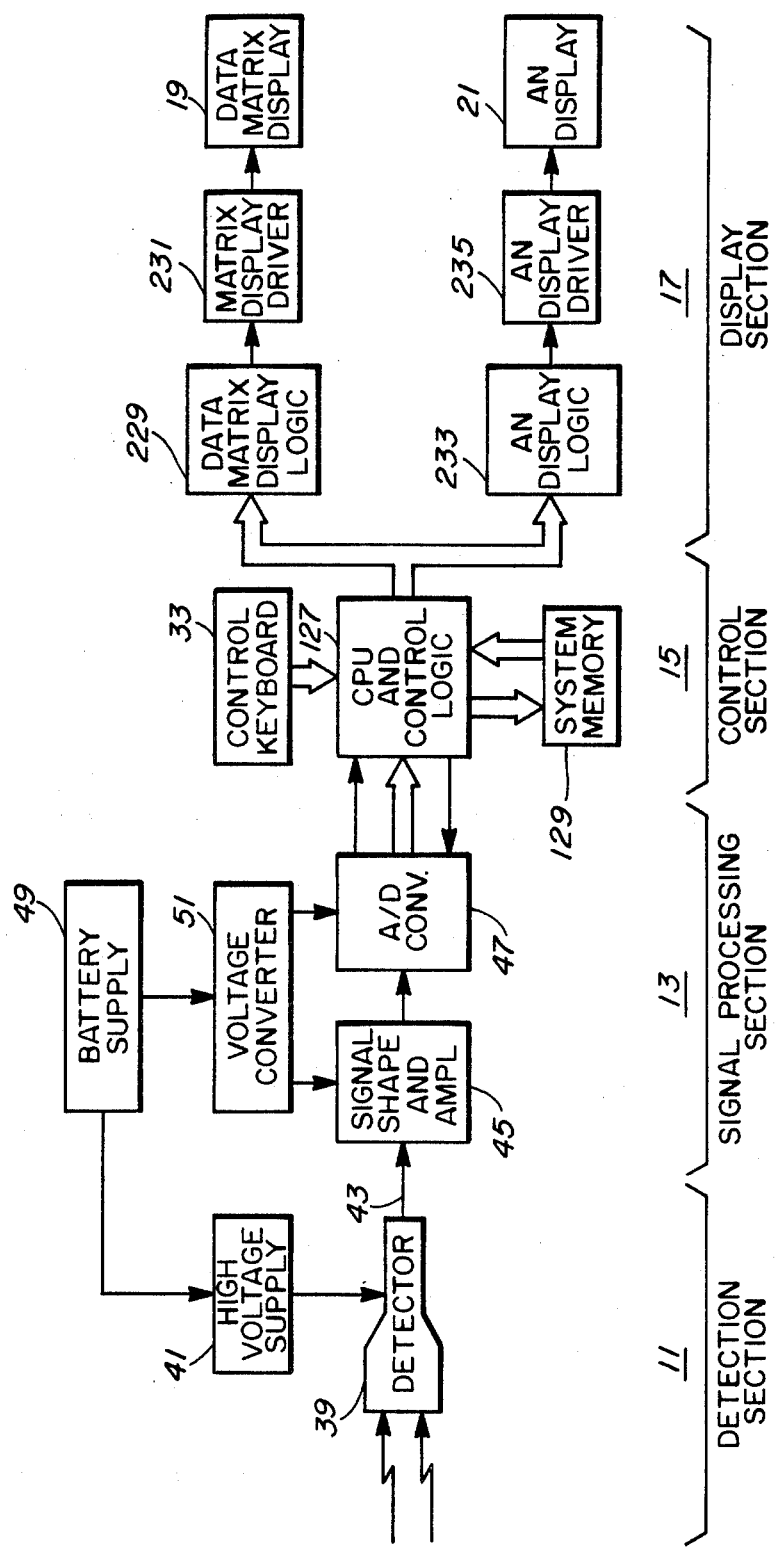
FIG. 1 is a block diagram of a preferred embodiment of the present invention shown divided into detection, signal processing, control and display sections.

With reference to FIG. 1, the present invention comprises four basic sections, a detection section 11 wherein pulses are detected and converted into small electrical pulses, a signal processing section 13 wherein the small electrical pulses from the detection section 11 are amplified, processed, and converted into digital signals, a control section 15 wherein the digital signals from the signal processing section 13 are stored and digitally processed for a display in the display section 17 which displays received radiation pulses on a data matrix display 19 and control and display information on an alphanumeric display 21.

Figure 2:
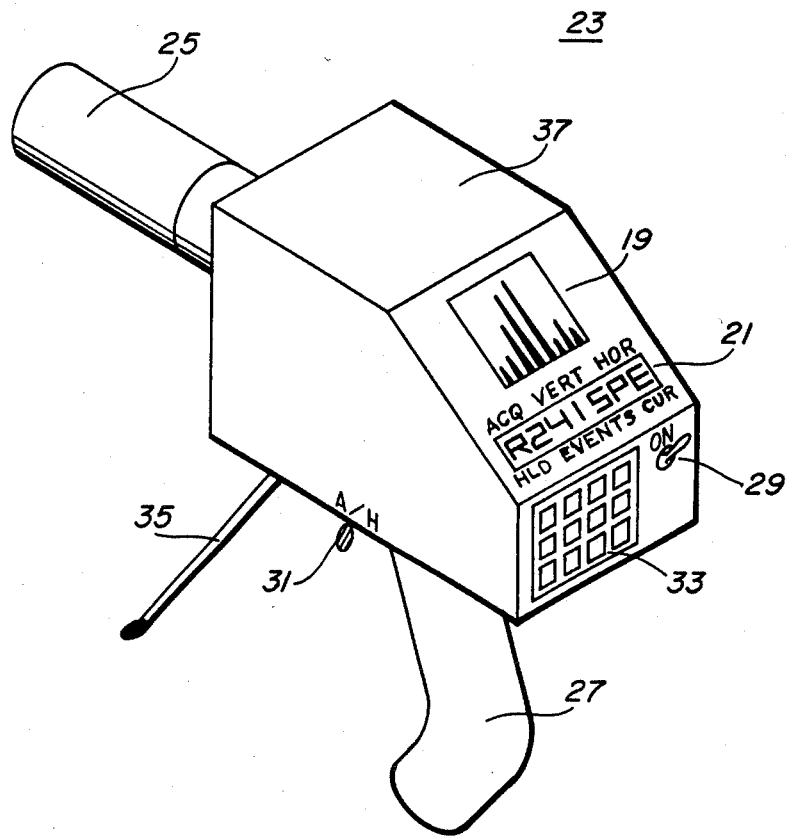
FIG. 2 is an illustration of a hand-holdable packaging of the preferred embodiment of FIG. 1.

As will be detailed hereinafter, the present invention is preferably packaged in a hand-holdable self-contained unit 23, see FIG. 2. A gun type barrel 25 houses the detector section 11 of FIG. 1. A rechargeable light weight power source (not shown) is contained within a handle 27. An on-off switch 29 is provided as well as a data acquisition or hold switch 31 (a/h) to control the invention as to its mode of operation in either acquiring data or holding and thus storing it. A keyboard control 33 permits the operator to select various scalings and modes of operation. The alphanumeric display 21 reads out the modes of operation selected, and the data matrix display 19 shows the data either as being acquired or stored. Preferably a pair of collapsible legs 35 (one shown) are provided so that the unit 23 may be either hand held or rested on a flat surface.

The electronics for the signal processing section 13, the control section 15, and the display section 17, are contained within the main housing 37. Using the preferred implementation described here below the hand holdable unit 23 can be packaged to weigh less than two kg and have a six hour lifetime on four AA Ni-Cd batteries.

The detection section 11 comprises a detector 39 and high voltage supply 41, see again FIG. 1. Preferably, the detector comprises a NaI(Tl) crystal as a basic detector coupled to a standard phototube such as RCA type 6119. The invention can however accommodate other types of detectors such as cadmium telluride (CdTe), which offers higher sensitivity per unit volume.

The high voltage supply 41 supplies a variable output voltage from 0 to about 1900 volts to the detector 39. The high voltage supply of 41 is a low current power supply preferably adapted from the low current power supply design for a portable survey instrument designed by the Los Alamos National Laboratory, M. A. Wolf, "Portable Survey Instrument for Low Levels of Transuranic Contaminants," LA-UR-6860-MS (July 1977). With continued reference to FIG. 1 it can be seen that the output 43 of detector 39 is fed to the signal processing section 13 where it is amplified and shaped in a signal shaper and amplifier 45 and then converted to digital format in an A to D converter 47. Four AA Ni-Cd batteries 49 power the invention and are converted into other usable low level voltages by voltage converter 51.

Figure 3:
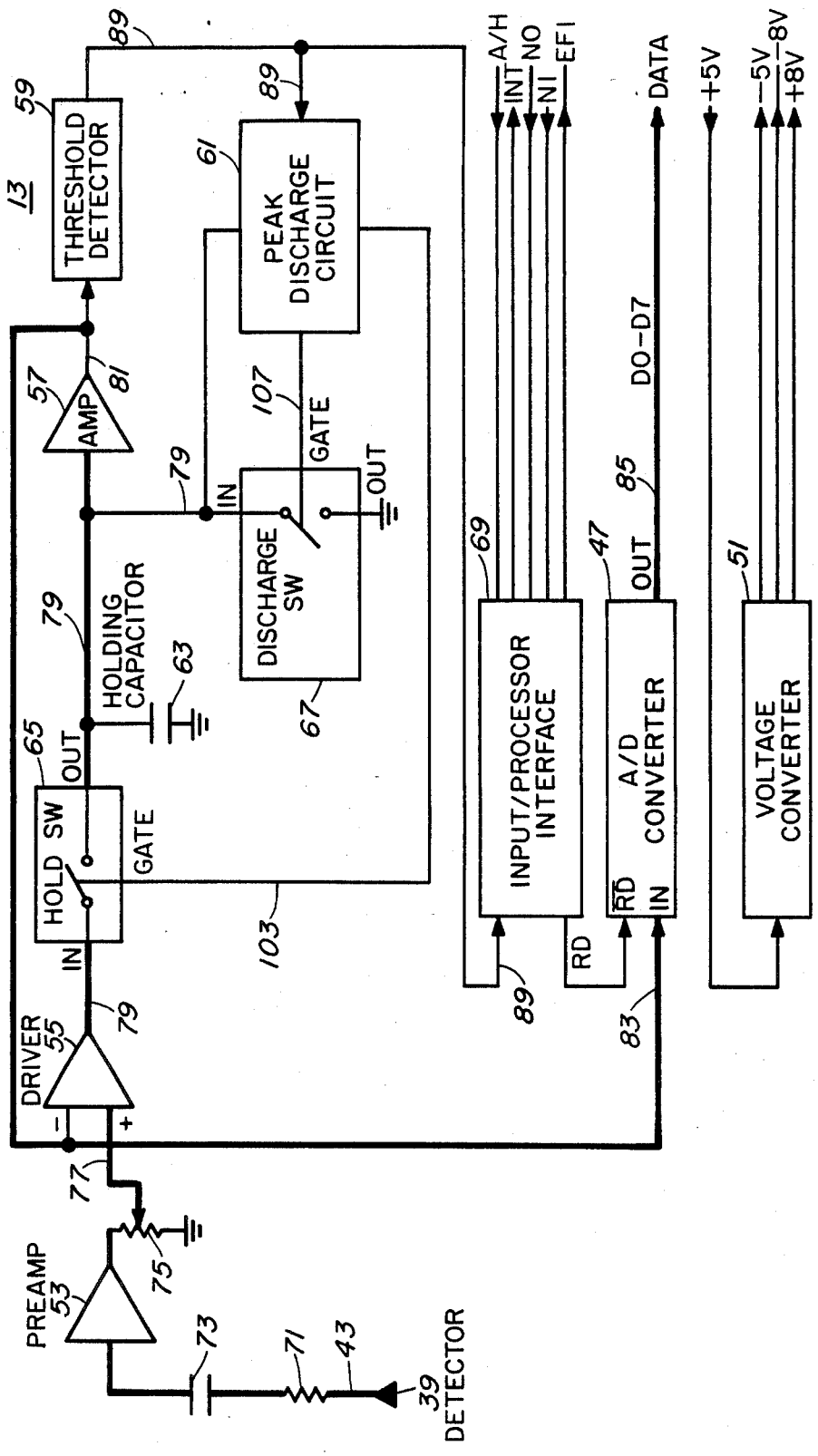
FIG. 3 is a detailed blocked diagram of the detection section shown in FIG. 1.

A detailed circuit diagram of the signal processing 13 is shown in FIG. 3. The output 43 of the detector 39 is amplified in preamp 53, driver 55, and amplifier 57 to be converted into a digital signal by analog to digital converter 47. In order to properly digitize short pulses and to provide further signal processing, a threshold detector 59 is employed in conjunction with a peak discharge circuit 61, a holding capacitor 63, a hold switch 65, and a discharge switch 67. Also to provide proper interfacing with the control section 15 and input/processor interface circuit 69 is employed.

The output 43 of detector 39 is fed to preamp 53 through a resistor 71 and a capacitor 73 to provide dc isolation and signal protection for the preamplifier 53. The preamplifier 53 is preferably a CMOS operational amplifier such as RCA model CA3130. The preamplifier 53 is a standard charge-sensitivity amplifier having a 50 microsecond shaping time. Following the preamplifier 53 is a gain adjustment potentiometer 75 which permits the amplifier 53 gain to be adjusted for various detectors 39 and environments to be monitored.

The gain adjusted output 77 of the gain adjustment potentiometer 75 is fed to driver 55 for further signal amplification. The driver 55 is preferably an operational amplifier of the CMOS type and may be the same type as used for preamplifier 53. Preferably, the driver 55 further includes at its output 79 an emitter follower type circuit to provide a low impedance output to charge the holding capacitor 63 through the hold switch 65.

The hold switch 65 and the discharge switch 67 are shown schematically in FIG. 3 as physical switches. However, it is preferred for the purpose of minimizing size and current consumption that these switches be implemented as solid switches such as the National Semiconductor CDC4066BM quad-bilateral switch. It is appreciated that the purpose of hold switch 65 is to charge holding capacitor 63 and the purpose of the discharge switch 67 is to discharge the holding capacitor 63. In this fashion and with proper timing a very fast pulse can be captured by the holding capacitor 63 for a period sufficient to permit digitizing thereof.

The output 79 of hold switch 65 is fed to amplifier 57. Again, the amplifier 57 is preferably a low current implementation such as the before mentioned RCA type CA3130. The output 81 of amplifier 57 is fed back to the driver 55 in a negative feedback fashion for conventional reasons of stability and gain stabilization and to the input 83 of analog to digital converter 47.

The analog to digital converter 47 digitizes the analog output 81 of amplifier 57. The converter 47 generates a digital word whose magnitude is related to the energy of a detected input pulse. Preferably, the converter 47 has a parallel output 85 of eight data bits designated as D0 through D7. Preferably, the A to D converter 47 is implemented in low current circuitry employing successive approximation techniques to provide conversion times on the order of 15 $\mu$s. A suitable device for element 47 would be the Analog Devices CMOS microprocessor compatible eight bit analog-to-digital converter model AD7574.

Figure 4:
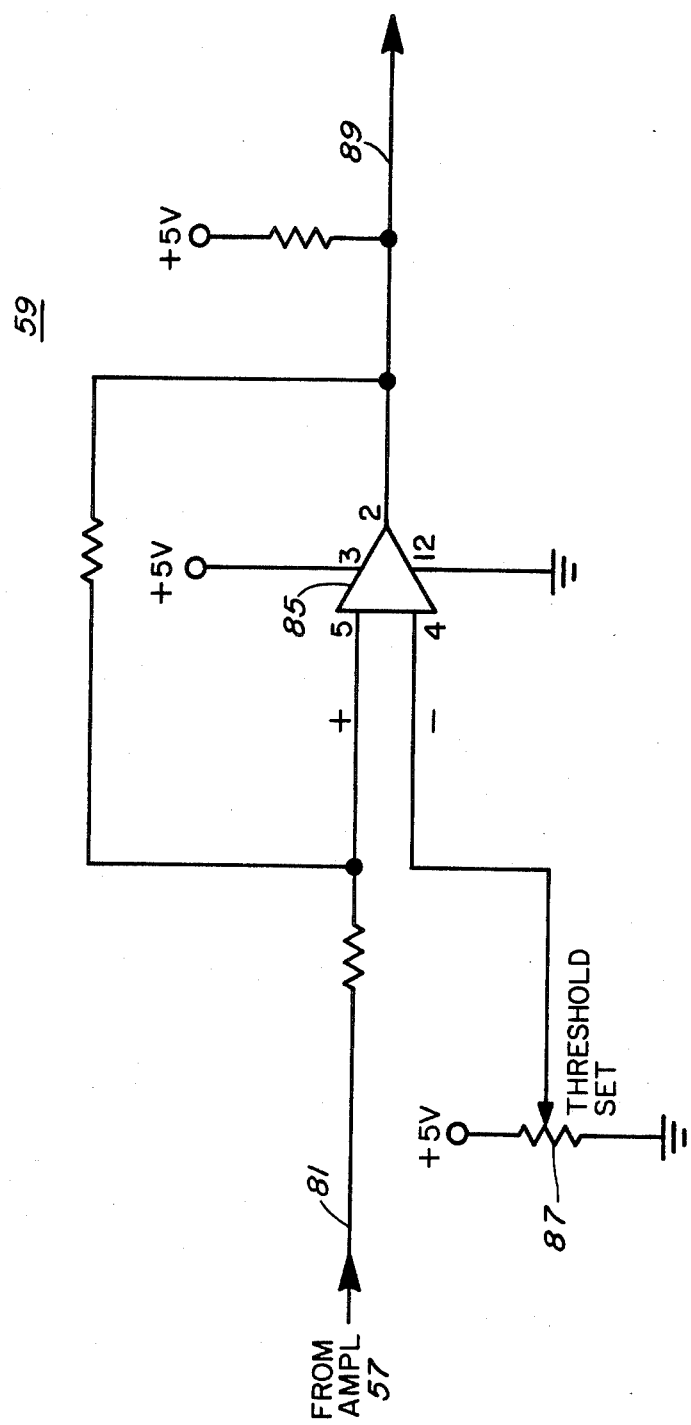
FIG. 4 is a circuit diagram of a threshold detector shown in FIG. 3.

Besides amplification and digitization, there is a need for signal processing so that the pulses received by detector 39 can be shaped into a form suitable for digitization and so that small background signals and pulses below a preset threshold are not digitized but are ignored. For this purpose, a threshold detector 59 is employed, see FIG. 4. The threshold detector 59 employs a low current voltage comparator 85 in a positive feedback mode and has an adjustable threshold setting through potentiometer 87. The output 89 of the threshold detector 59 is at one level when the signal from the amplifier 57 output 81 exceeds the set threshold on potentiometer 87 and at another level when the output 81 is below that set threshold. The output 89 is fed to the peak discharge circuit 61 and the input-processor interface 69, see again FIG. 3.

Figure 5:
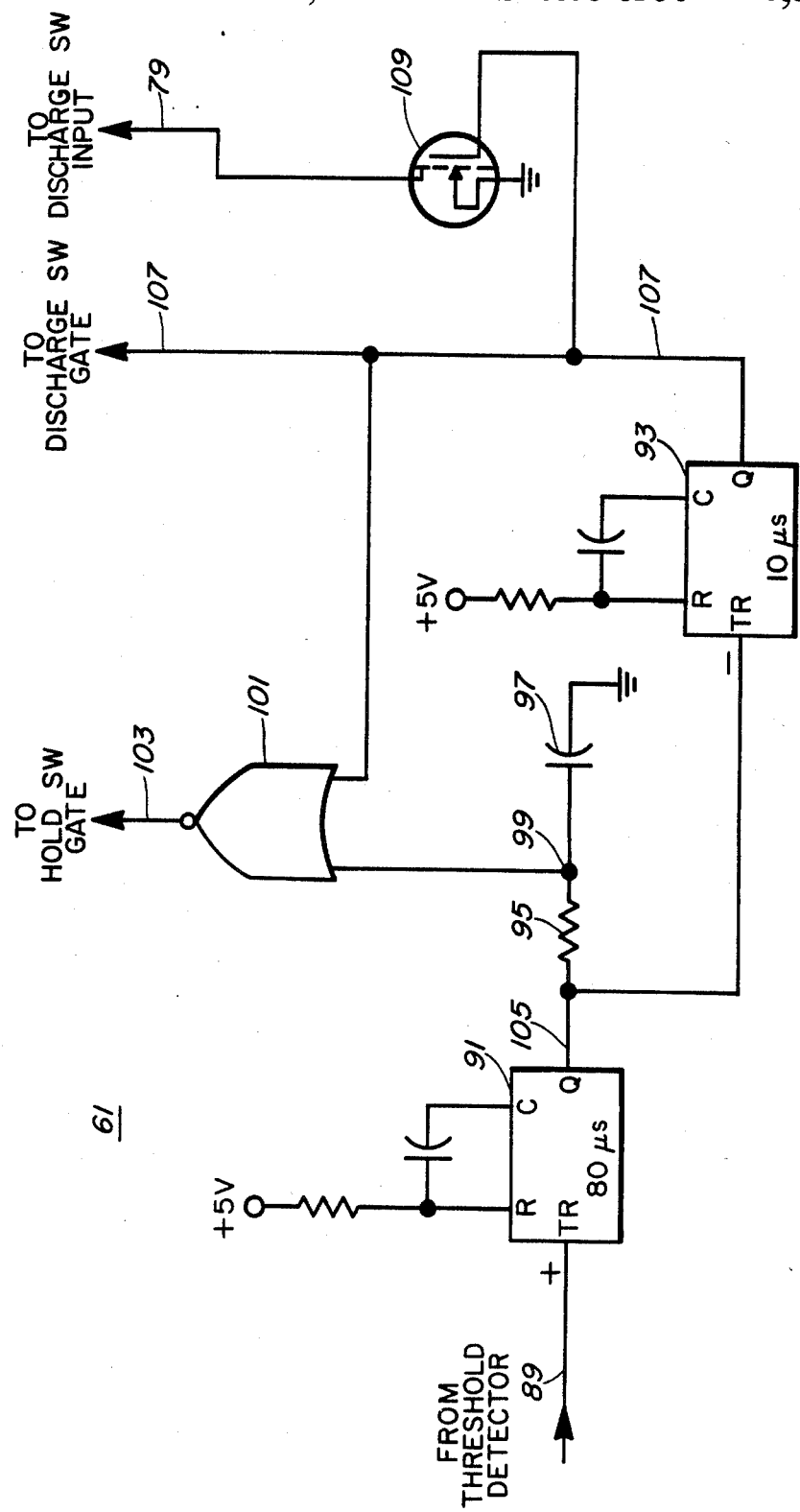
FIG. 5 is a circuit diagram of a peak discharge circuit shown in FIG. 3.

The peak discharge circuit 61 functions upon the detection of a pulse exceeding the threshold level to open the hold switch 65 in order to maintain a voltage upon the holding capacitor 63 for a period sufficient to digitize that voltage and then to quickly discharge the voltage on the holding capacitor 63 through discharge switch 67 and reclose the hold switch 65 so that subsequent pulses may be detected and digitized also. With reference to FIG. 5, it may be seen that the peak discharge circuit 61 includes a hold single-shot 91 with a time constant of 80 $\mu$s and a discharge single-shot of 10 $\mu$s period. Both, the hold single-shot 91 and the discharge single-shot 93 may be implemented by a low current circuitry such as the National Semiconductor CD4098. The output 89 from the threshold detector 59 is used to trigger the hold single-shot 91. However, the instant that a threshold is exceeded may not be the same instant that the incoming signal or pulse has achieved its peak. For this reason there is a slight delay introduced in the output of the hold single-shot 91 by means of resistor 95 and capacitor 97. The signal on the junction 99 between the resistor 95 and the capacitor 97 is fed into NOR gate 101 and from there to line 103 which functions to control the gate on hold switch 65. Thus shortly after a threshold signal is received, the hold switch 65 opens for a period of 80 $\mu$s. This allows the input pulse to be held on holding capacitor 63 for a period sufficient to permit digitization thereof. The output 105 of hold single-shot 91 is used to trigger the discharge single-shot 93 for a period of 10 $\mu$s to discharge the holding capacitor 63 by a discharge switch 67. The output 107 of the discharge single-shot 93 is fed to the gate of the discharge switch 67 and also through NOR gate 101 in order to keep the hold switch 65 off. This is done assured that the output 79 of driver 55 is not fed directly into a short to ground. Further, the output 107 of discharge single-shot 93 is fed through a MOS gate 109 the the output 79 of hold switch 65 in order to very quickly discharge capacitor 63. The MOS gate 109 is an extremely fast switch functioning in the order of 12 ns but nevertheless having some minute resultant bias to ground thereby not completely and fully discharging the holding capacitor 63. Thus in essence, the MOS switch 109 quickly begins the task of discharging of capacitor 63 and the discharge switch 67 completes the job. It is important that the holding capacitor 63 be discharged as quickly as possible since incoming signals are not detected during this period. Thus a very fast acting MOS switch 109 should be chosen, such as the IVN5000.

With reference again to FIG. 3, it can be seen that the output 89 of the threshold detector 59 is also fed to the input/processor interface circuit 69. The input/processor interface 69 outputs a signal identified as EF1 which is in essence a flag signifying that the threshold detector 59 has detected a signal to be stored or displayed. Also a signal INT is generated which is in essence an interrupt to a processor which will be described below. Receiving from the processor to be described below are two input output signals N0 and N1 which in essence indicate that the processor is ready to receive data. A final input line is the A/H line which indicates to the input processor interface 69 whether the present invention is operating under an acquire data mode or hold data mode. Finally, the interface 69 outputs an RD signal to the A-to-D converter 47 to initiate the conversion of analog data to digital data.

Figure 6:
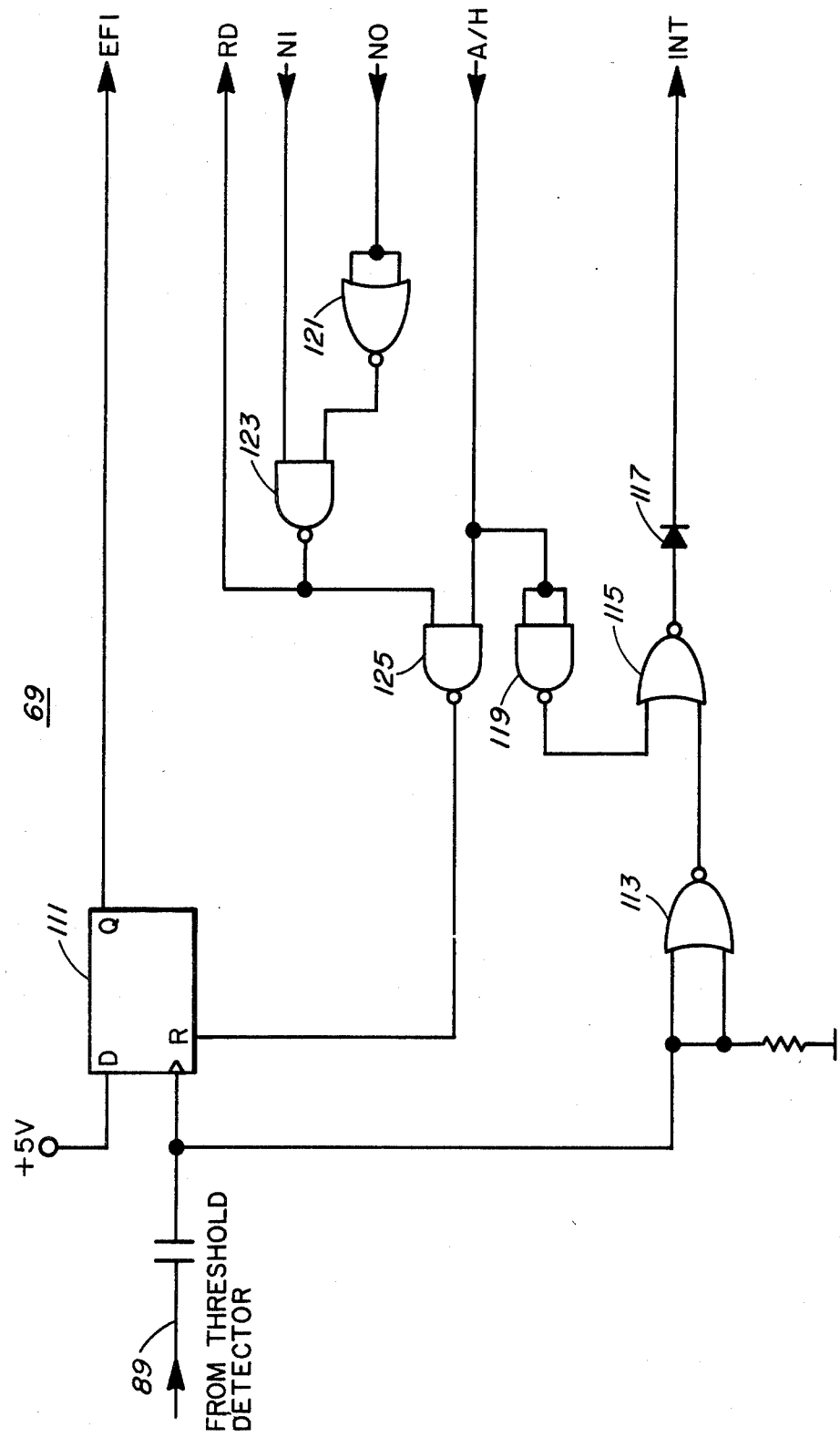
FIG. 6 is a detailed logic diagram of an interface/processor interface circuit shown in FIG. 3.

The input/processor interface circuit 69 is detailed in FIG. 6. The threshold detect signal 89 from the threshold detector 59 is inputted to a D flip flop 111. Also the input 89 is fed through NOR gate 113, NOR gate 115 and diode 117 to provide an interrupt signal INT. It is noted that the interrupt signal is not sent unless the A/H line indicates that the invention is in the acquire data mode and passes this information through NAND gate 119 to the NOR gate 115. Obviously if the invention is not in the acquiring data mode, there is no sense to further process the data that is detected. The flag EF1 and the interrupt signal INT are sent out to a processor. When the processor is ready to receive data, its input/output lines N0 and N1 are set to proper levels and fed through NOR gate 121 and NAND gate 123 to initiate a read RD signal to begin the analog to digital conversion. Further, the N0 and N1 signals are combined and fed through NAND gate 125 to reset the D flip flop 111.

With reference again to FIG. 3, it can be seen that the read RD signal from the input processor interface 69 is fed to the A-to-D converter 47 to begin the conversion of the analog signal on output line 81 of amplifier 57. When the read RD signal is presented to the A-to-D converter 47 an analog to digital conversion is initiated on the signal presented at the input 83. The parallel output 85 of the A-to-D converter presents eight bits of data designated D0 through D7 which digitally represent the analog value at the input 83. Preferably, the A-to-D converter 47 is implemented in low power circuitry and has a fast conversion time on the order of 15 $\mu s$. Such a device is the Analog Devices model AD7574. Although the preferred embodiment utilizes eight bit parallel data conversion, it is appreciated that more or less resolution or conversion speed may be appropriate in various circumstances.

Also, included in the signal processing section 13 is a voltage converter 51. The purpose of the voltage converter is merely to convert power supplied by the Ni-Cd batteries 49 into other voltages such as may be used by various analog and digital devices of the invention. For example, the voltage comparator 51 may receive voltage on the order of plus 5 volts from the Ni-Cd batteries 49 and generate therefrom $-5$ volts, $-8$ volts, and plus 8 volts. Obviously, other voltages could be provided as required. A suitable voltage converter is the Intersil model ICL7660.

Figure 7:
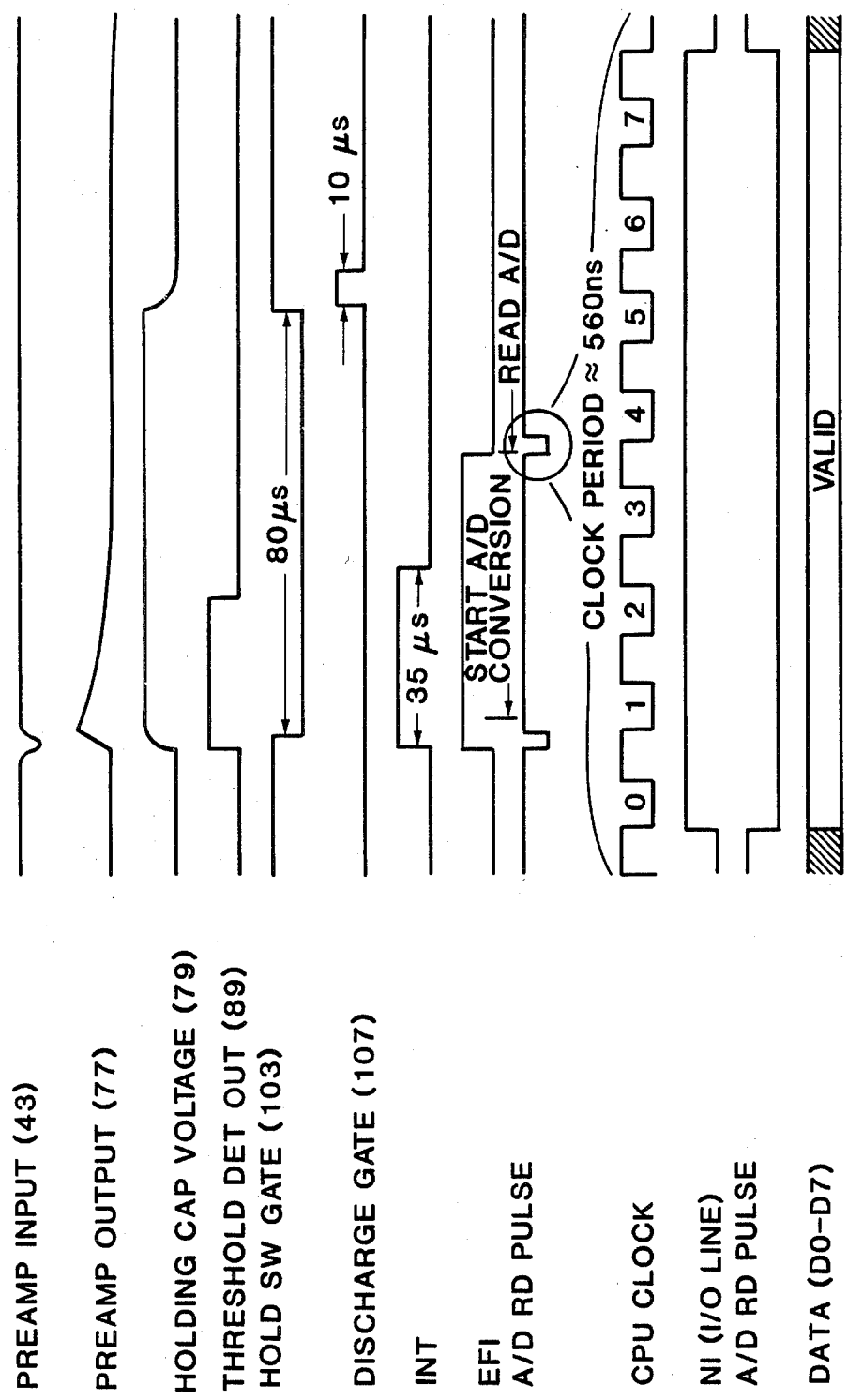
FIG. 7 is a timing diagram of the detection section shown in FIG. 3.

A summary of the functioning of the signal processing section 13 is shown in timing diagram format in FIG. 7. It is noted that the CPU clock is shown in FIG. 7 although it is not provided directly to the signal processing section 13 it nevertheless shows that eight clock pulses designated 0 through 7 are utilized to complete the conversion from analog to digital of the data in the A-to-D converter 47.

Figure 8:
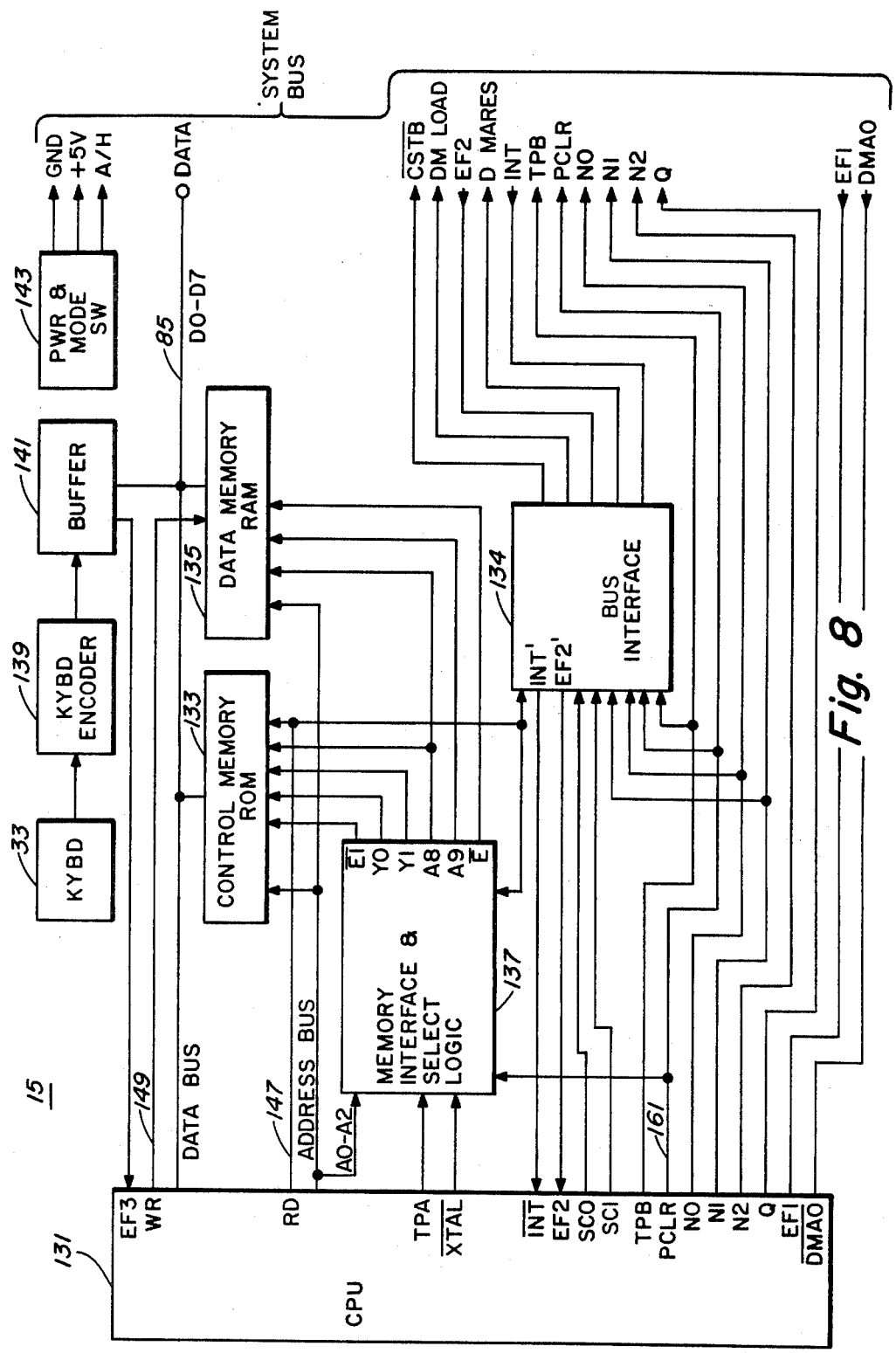
FIG. 8 is a detailed block diagram of the control section shown in FIG. 1.

With reference again to FIG. 1, can be seen that once the A to D conversion occurs signals are passed from the signal processing section 13 to the control section 15 comprising as major components the control keyboard 33, the CPU and control logic 127, and the system memory 129. With reference now to FIG. 8, it can be seen that the eight parallel data bits arriving on data bus 85 are fed to CPU 131 with control memory 133 and data memory 135, the control memory 133 and the data memory 135 comprising together the system memory 129 shown in FIG. 1. Again with reference to FIG. 8, it is shown that there is additional logic between the CPU 131 and the memories 133 and 135, this additional logic being designated the memory interface and select logic 137. Further, to commmunicate with other elements there is also connected to the CPU 131 a bus interface 134. For manual control of the CPU 131 there is the keyboard 33 which selects in essence the data to be displayed and the display modes relating as to relative scaling of the display and type thereof. To interface between the keyboard 33 and the CPU 131 there is a keyboard encoder 139 and a buffer 141. Finally to conclude the manual controls, there is a power and mode switch 143 which turns power on and also selects whether data is to be acquired or held.

Figure 9:
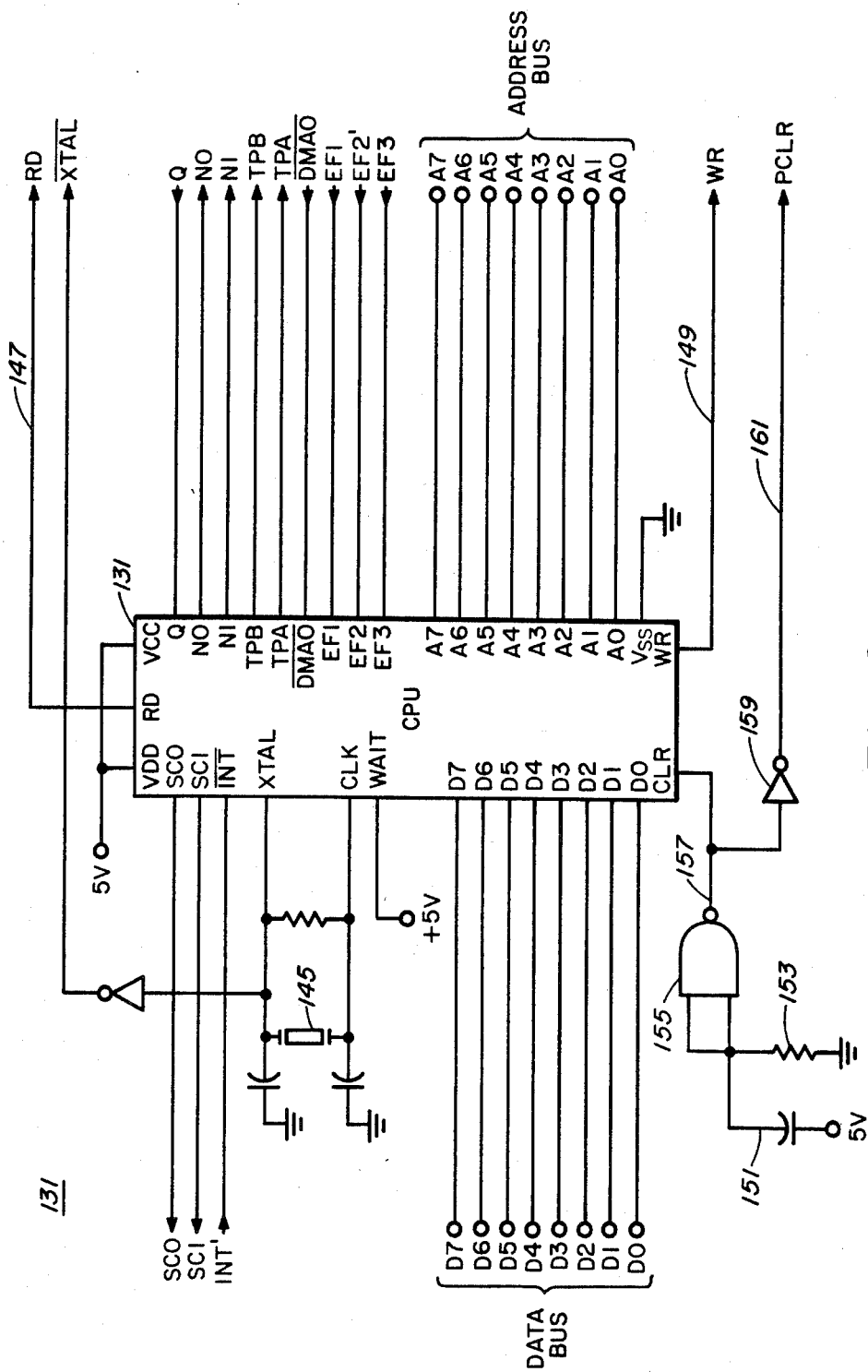
FIG. 9 is a detailed logic diagram of the microprocessor shown in FIG. 8.

The CPU, 131, see FIG. 9, is preferably a low power microprocessor such as the RCA-CDP1802. The clock pulses for the CPU 131 are generated from a crystal 145 operating at about 3.58 MHz. A read pulse is provided on line 147 and write pulse on line 149. To provide for initial turnon stabilization a capacitor 151 and a resistor 153 provide a time constant to NAND gate 155 which provides a signal on the clear line 157 and through an inverter 159 to the PCLR line 161.

Figure 10:
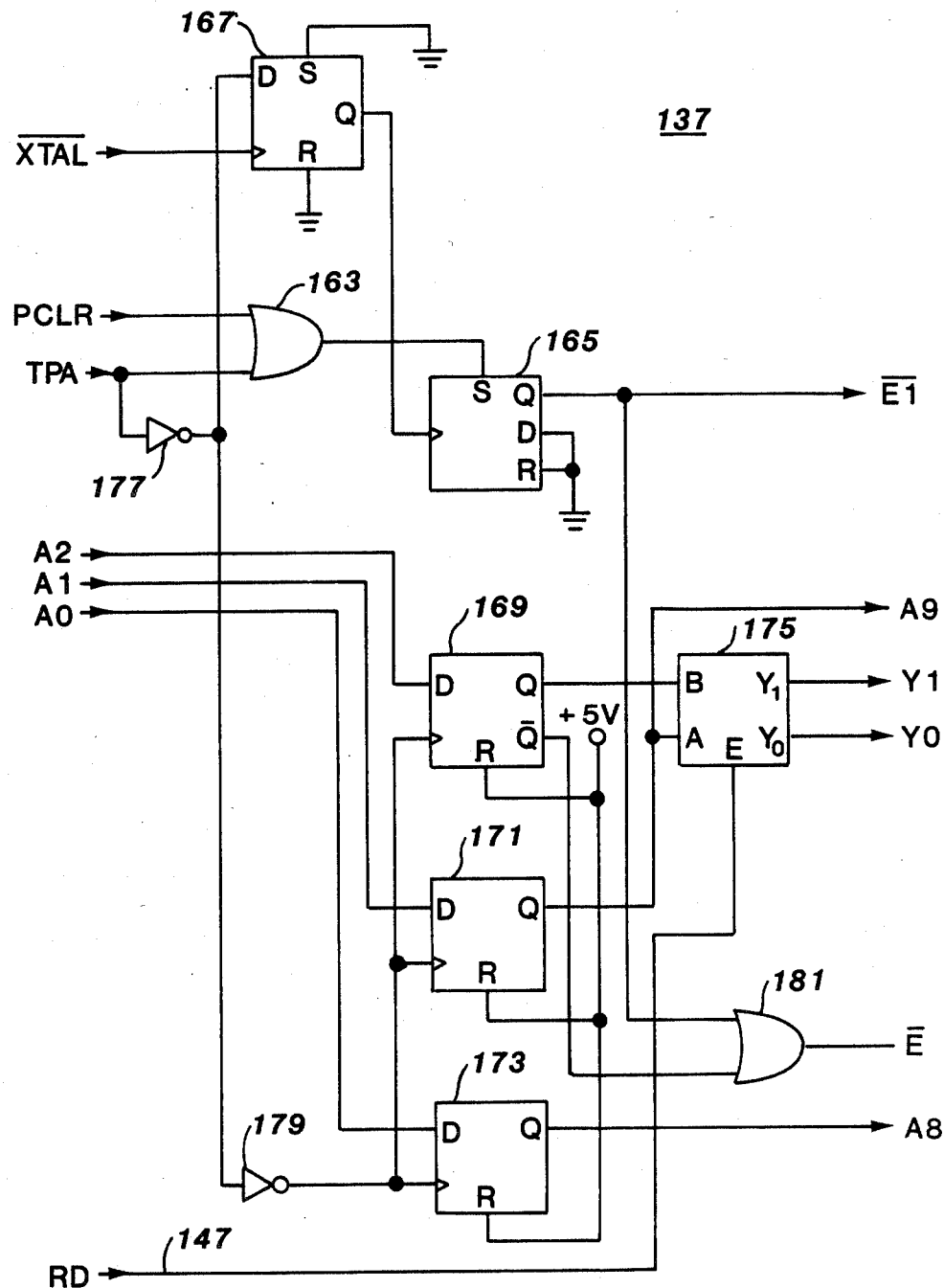
FIG. 10 is a detailed logic diagram of the memory interface and select logic shown in FIG. 8.

In the memory interface and select logic 137, see FIG. 10, the PCLR signal and the TPA signal from the CPU 131 are combined through OR gate 163 to set D flip flop 165. Four other D flip flops are used in the memory interface and select logic 137, these being D flip flops 167, 169, 171, and 173, all of which may be implemented with CMOS type circuitry. Also, a binary 1-of-4 decoder 175 (Motorola MC14556) is used in conjunction with D flip flops 169, 171, and 173 to convert the information on address lines A0, A1, and A2 into memory select signals Y0 and Y1. Further, inverters 177 and 179 are used with OR gate 181 to produce logic enable signals $\overline{E1}$ and $\overline{E}$. The output of D flip flop 171 is address line A9 while the output of D flip flop 173 is address A8.

Figure 11:
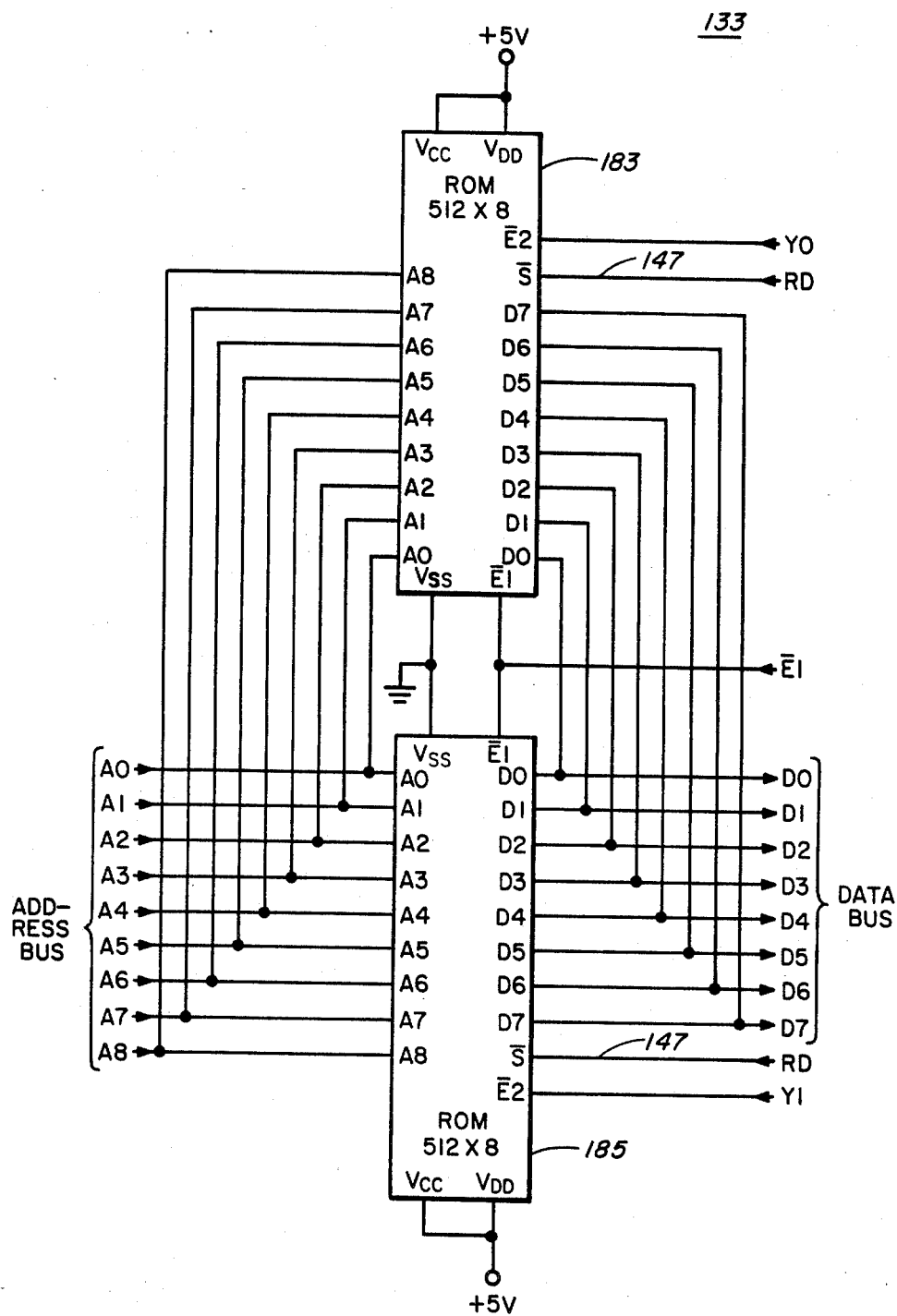
FIG. 11 is a detailed logic diagram of the control memory ROM shown in FIG. 8.

The memory interface and select logic 137 controls the control memory 133 and data memory 135. Control memory 133 is comprised of two $512\times8$ bit ROMS 183 and 185, see FIG. 11. The ROMS 183 and 185 are addressed by the CPU 131 on address lines A0 through A7 and by the memory interface and select logic 137 on address line A8. Further, a read signal RD is provided from the CPU 131 to each of the ROMS 183 and 185. Other control signals are provided from the memory interface and select logic 137 on lines Y0, Y1, and $\overline{E1}$. Data is outputed on the data lines D0 through D7. Information in the ROMS 183 and 185 relate to the mode of operation and scaling of display signals.

Figure 12:
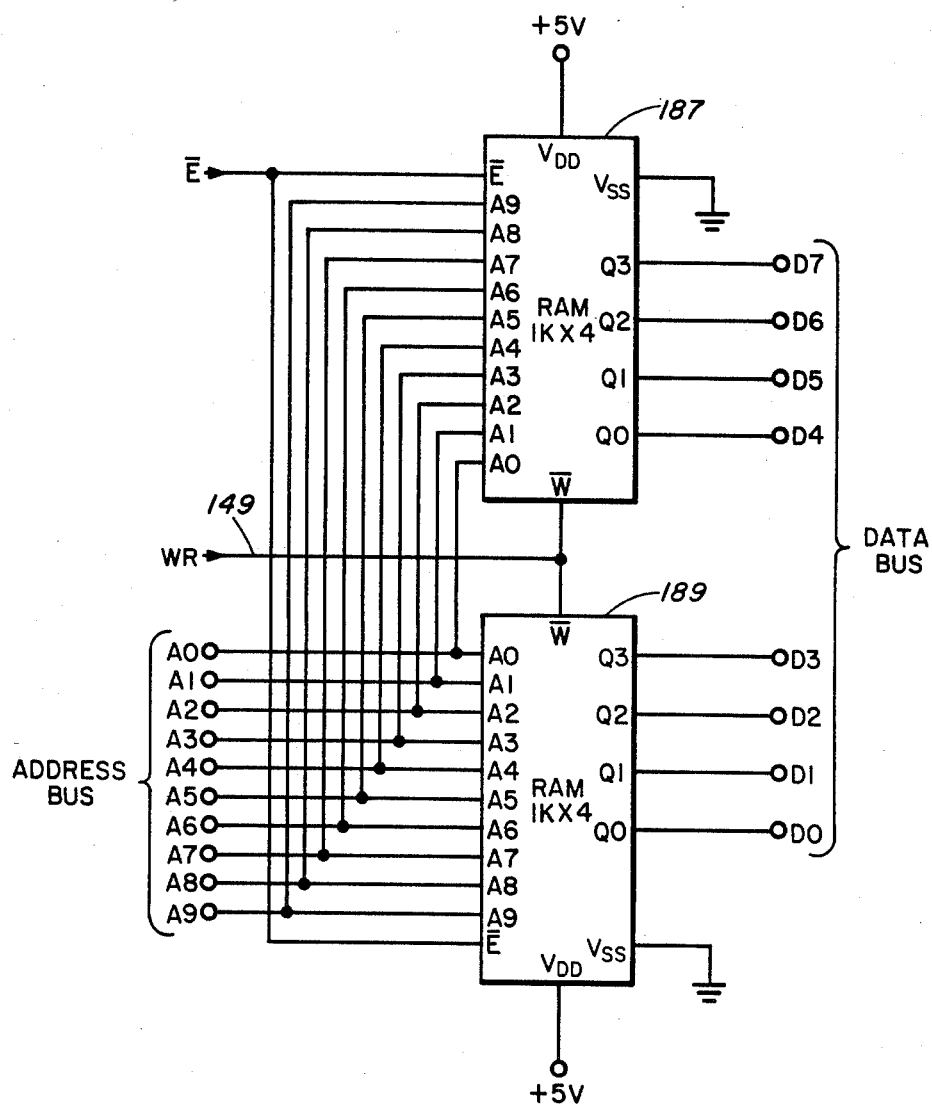
FIG. 12 is a detailed logic diagram of the data memory RAM shown in FIG. 8.

The memory interface and select logic 137 also controls the data memory 135. The data memory 135 comprises two 1K by 4 RAMS 187 and 189, see FIG. 12. Again, the RAMS 187 and 189 are addressed by the CPU 131 on address lines A0 through A7 and by the memory interface and select logic 137 on address lines A8 and A9. Further, a write signal WR is provided from the CPU 131 and an enable signal $\overline{E}$ is provided by the memory interface and select logic 137. Data is outputted on data lines D0 through D7.

With brief reference again to FIG. 8, it's appreciated that data can be manually controlled by keyboard 33 through keyboard encoder 139 and buffer 141. The keyboard 33 preferably is a 12-key keyboard having two vertical scale keys, two horizontal scale keys, two scroll keys, a main/memory mode key, a reset key, and four keys reserved for future use. The two vertical scale keys allow the operator to scale the vertical display. The two horizontal scale keys allow the operator to expand or contract the display horizontally. The two scroll keys can be used to roll the display left or right through the data memory 135. When scrolled, the display will roll left or right until the top or bottom of the data memory 135 is reached at which time scrolling ceases. The main/memory mode key selects which of the two 128-channel blocks of data will be displayed on the $32\times32$ matrix display 19. The display comes up in the main mode, which is the first data block. If the main/memory mode key is pushed, the display switches to memory, which is the second data block. Depressing the main/memory mode key again puts the display back in the main mode. Thus, the storage of a spectrum in one data block can be later compared with another spectrum. The reset key resets the data memory 135 to zero whether the main or memory mode is being utilized. The keyboard 33 may be of a Grayhill type 83AB1 or equivalent.

Figure 13:
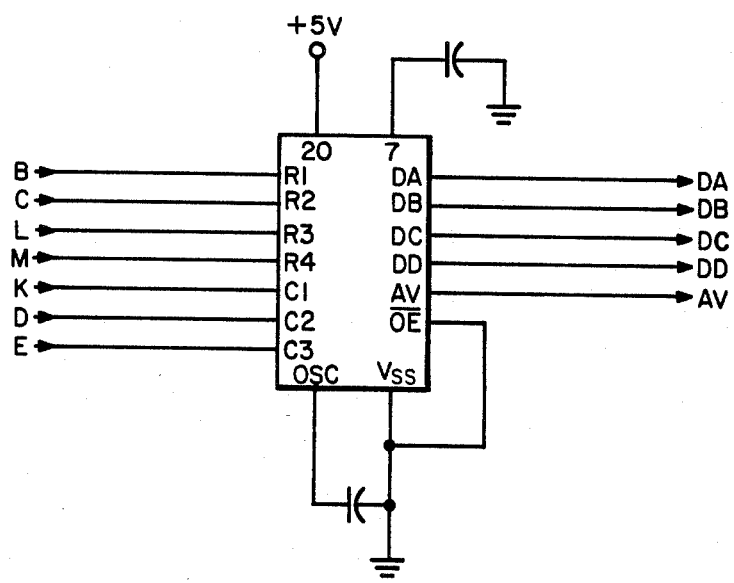
FIG. 13 is a logic diagram of a keyboard encoder shown in FIG. 8.

With reference now to FIG. 13, it's appreciated that the on-off switch signals of keyboard 33 as designated B, C, L, M, K, D, and E, are encoded into binary data and outputed on lines DA, DB, DC, DD, with another signal designating that the output data is available. This other signal being outputted on line AV. Suitable implementation for the keyboard encoder 139 shown in FIG. 13 is the National Semiconductor model MM74C923.

Figure 14:
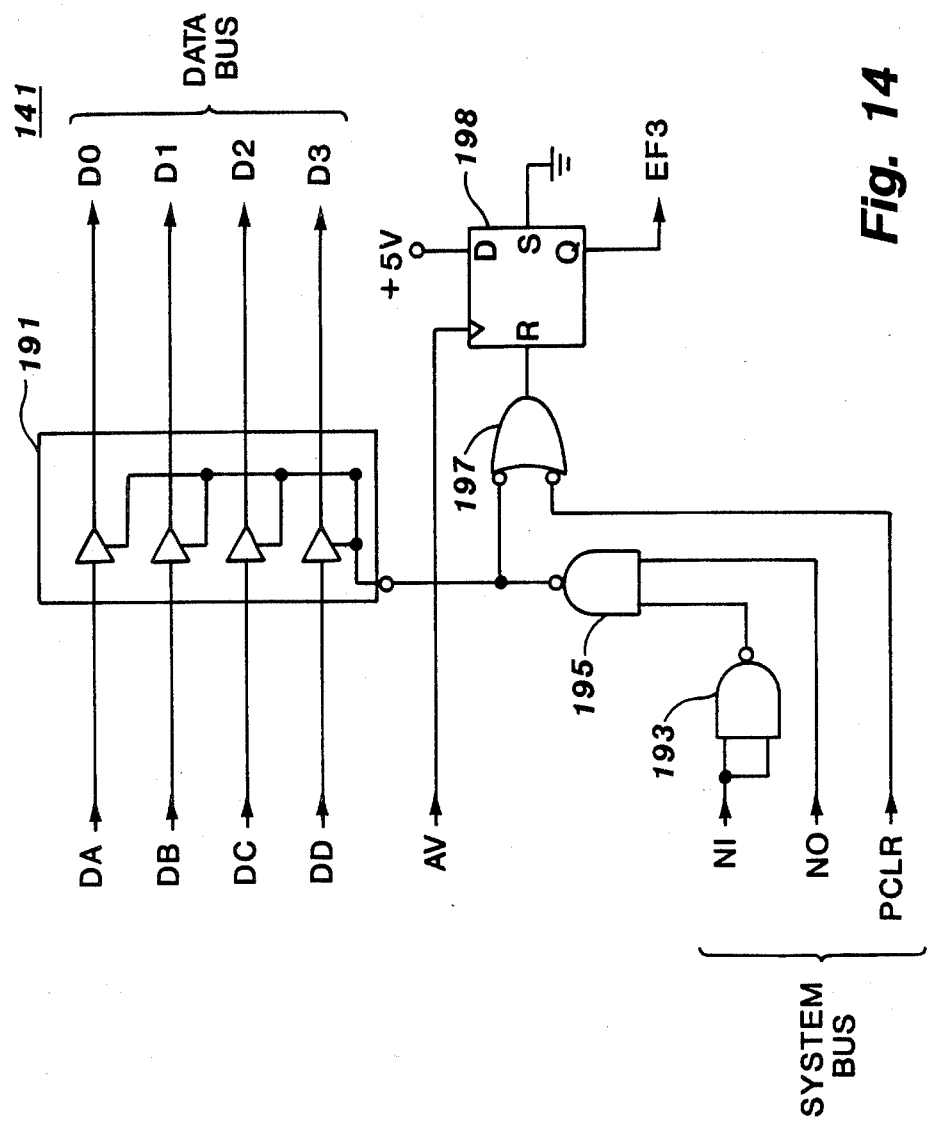
FIG. 14 is a detailed logic diagram of a buffer shown in FIG. 8.
Figure 15:
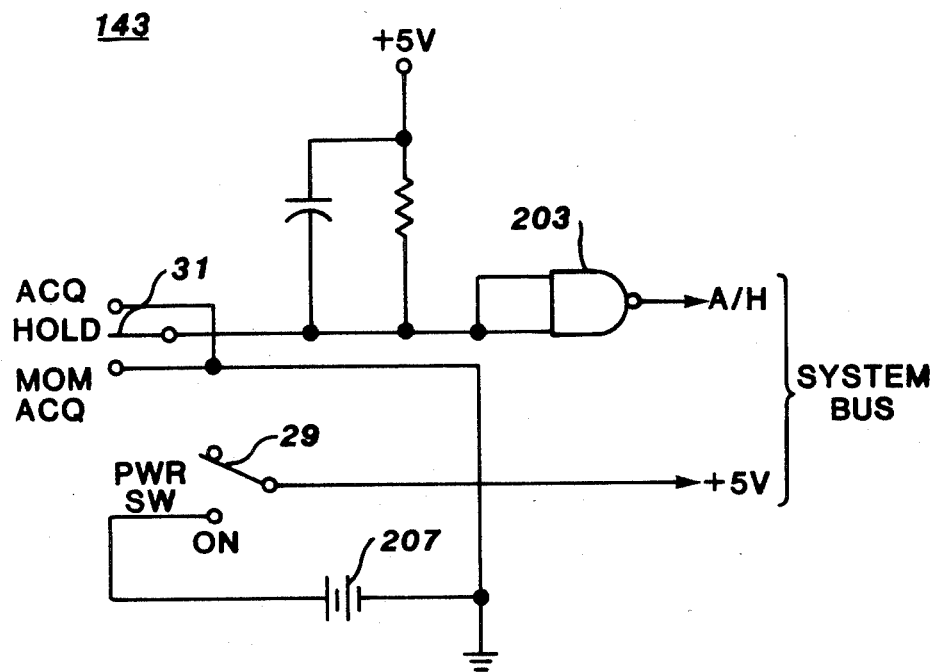
FIG. 15 is a detailed circuit diagram of a power and mode switch circuit shown in FIG. 8.

The output of the keyboard encoder 139 is fed to the buffer 141, see FIG. 14. Data signals DA, DB, DC, and DD are buffered through quad-buffer 191 to become directly the data signal D0 through D3. Suitable implementation for the buffer 191 is the National Semiconductor MM80C97 hex-buffer. Additionally, two NAND gates 193 and 195 with inverted input OR gate 197 are used to control D flip flop 198 which functions in conjunction with the data available signal AV to generate as an output signal EF3 which functions as a flag for the CPU 131 to indicate to the CPU 131 that data is available from the keyboard 133.

With brief reference again to FIG. 8, it can be seen that the control section 15 includes further manual controls, namely the power and mode switch 143 which generates a switchable, 5 volt supply and an acquire or hold signal designated as A/H. The power and mode switch 143 includes an acquire or hold switch 31 which has an acquire position and an acquire momentary position wherein the switch once manually releases returns to the centerhold position. Acquire in this case implies that data is being acquired and hold indicates that data is being stored and not acquired. The acquired and hold switch 31 is fed through a NAND gate 203 functioning primarily as an inverter to produce the A/H signal. A power on-off switch 29 is used to switch the voltage from the battery 207 to provide for the system the plus 5 volt power. The battery supply 207 may preferably be made from 4 Ni-Cd batteries of the AA size.

Figure 16:
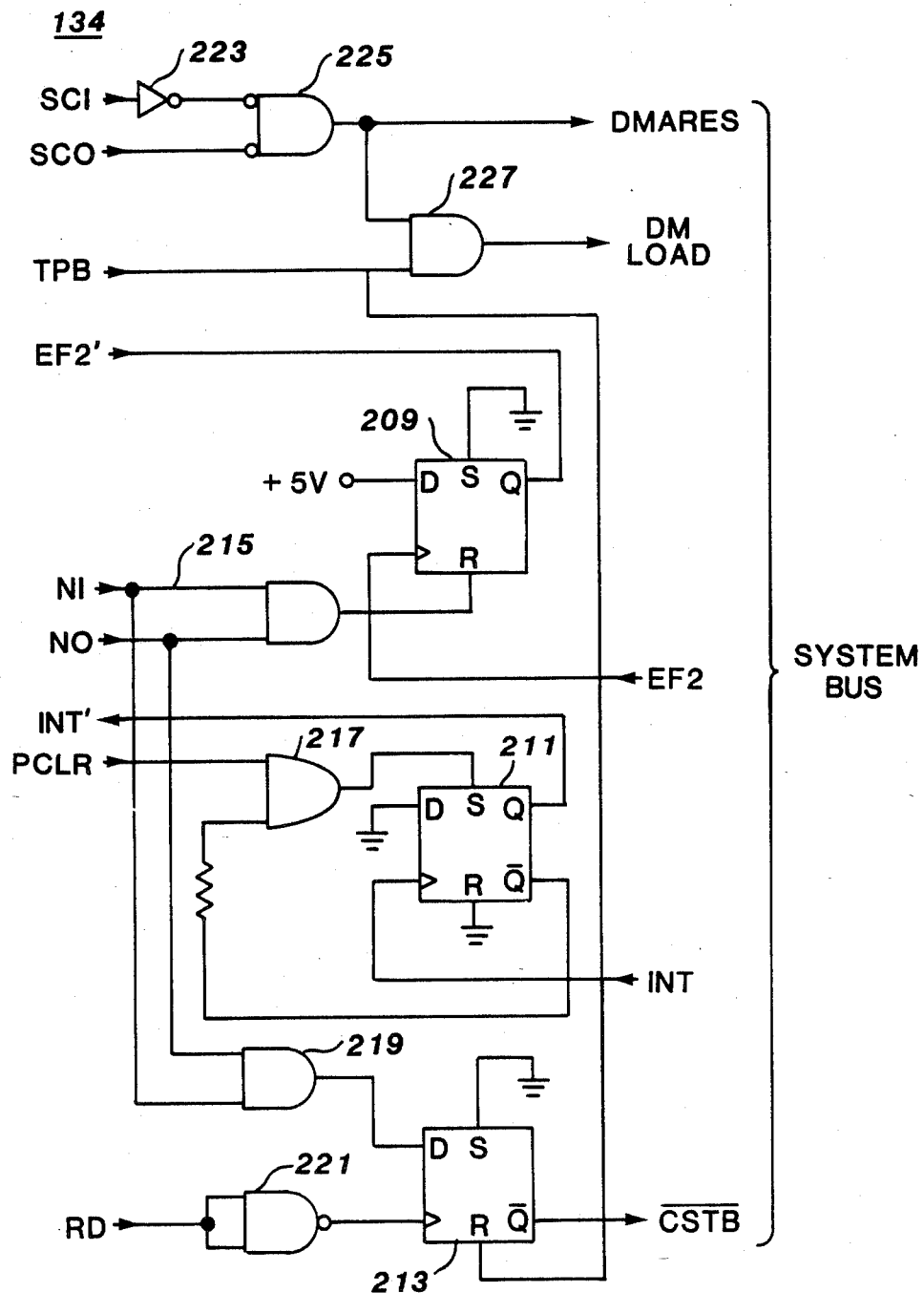
FIG. 16 is a detailed logic diagram of a bus interface circuit shown in FIG. 8.

To the complete the interfacing of the control section 15 a bus interface 134 is used, see FIG. 16. Primarily, the interfacing is accomplished through the timing attributes of D flip flops 209, 211, and 213. An AND gate 215 combines the signals N1 and N0 from CPU 131 to reset the D flip flop 209. The D flip flop 209 is inputted by the signal EF2 and generates the signal EF2'. Likewise, the PCLR signal from CPU 131 is fed through OR gate 217 to set the D flip flop 211 which is triggered by the signal INT to generate the signal INT'. The negative or $\overline{Q}$ signal from the D flip flop 211 is fed back to combine with the PCLR signal feeding OR gate 217. The signals N0 and N1 are combined in AND gate 219 to control D flip flop 213 which is triggered by the signal RD through NAND gate 221 and reset by the signal TPB from CPU 131. The negative or $\overline{Q}$ output of the D flip flop 213 generates the signal $\overline{CSTB}$. Additionally, SC0 and SC1 from CPU 131 are utilized with inverter 223, inverted input AND gate 225 and AND gate 227 to generate the signals DMARES and DM LOAD.

With brief reference again to FIG. 1, seen that the control section 15 is followed by a display section 17 having as major components thereof a data matrix display logic circuit 229, a matrix display driver 231, the data matrix display 19, the alphanumeric display logic circuit 233, the alphanumeric display driver 235, and the alphanumeric display 21. The data matrix display 19 displays the amplitude of pulses detected by detector 39 either as acquired or as held depending upon the mode of operation. The alphanumeric display 21 displays the mode of operation and the scaling for the data matrix display 19.

Figure 17:
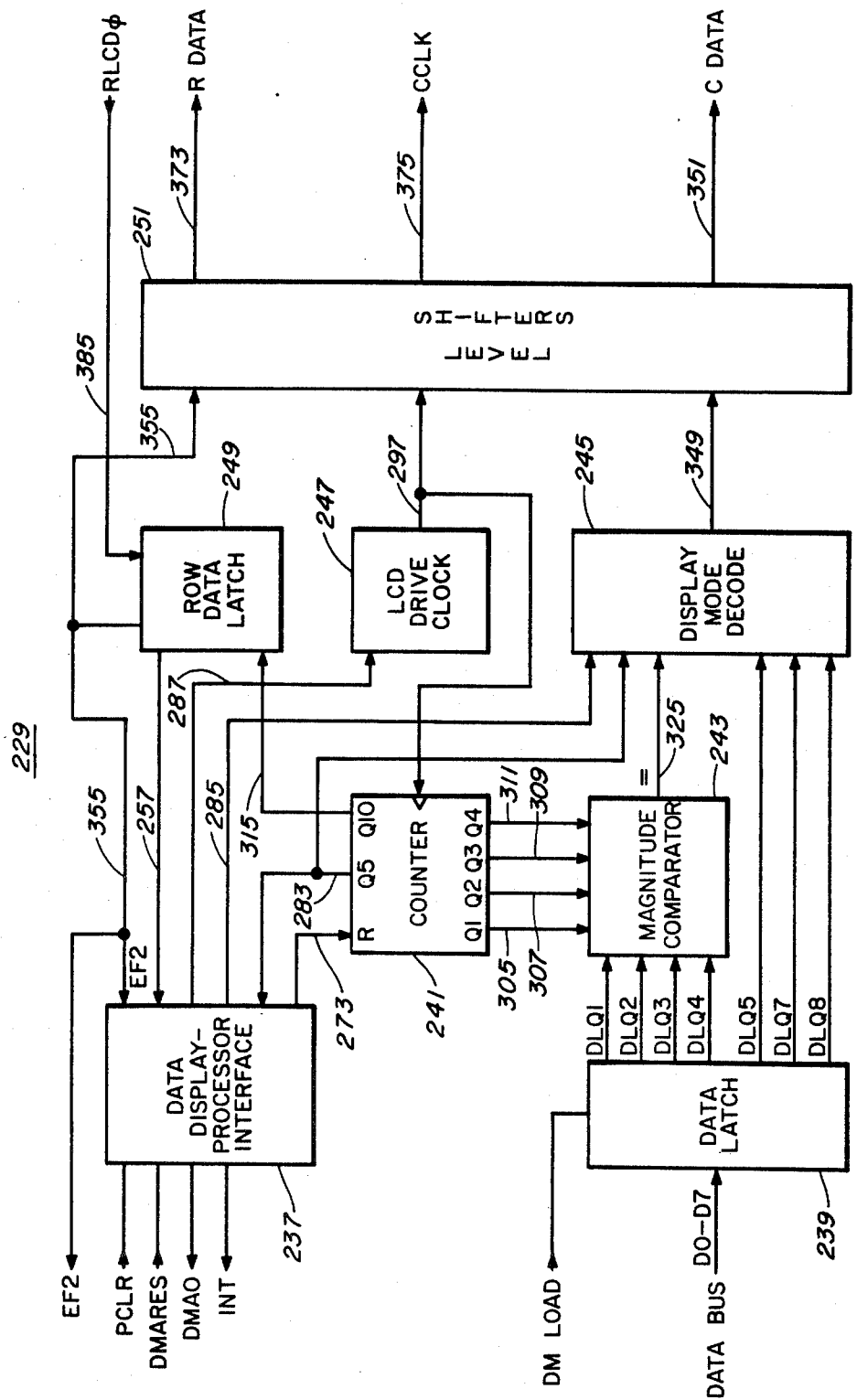
FIG. 17 is a detailed logic block diagram of a data matrix display logic circuit shown in FIG. 1.

With reference now to FIG. 17, the data matrix display logic 229 includes display-processor interface circuit 237, a data latch 239 to temporarily store data for the display thereof, a counter 241 to provide proper counting and synchronization functions, a magnitude comparator 243 functioning off the data latch 239, a display mode decoder 245, a liquid crystal display clock circuit 247 driving counter 241, a row data latch circuit 249, and to provide proper voltage levels to the display circuits a network of three levels shifters 251.

Figure 18:
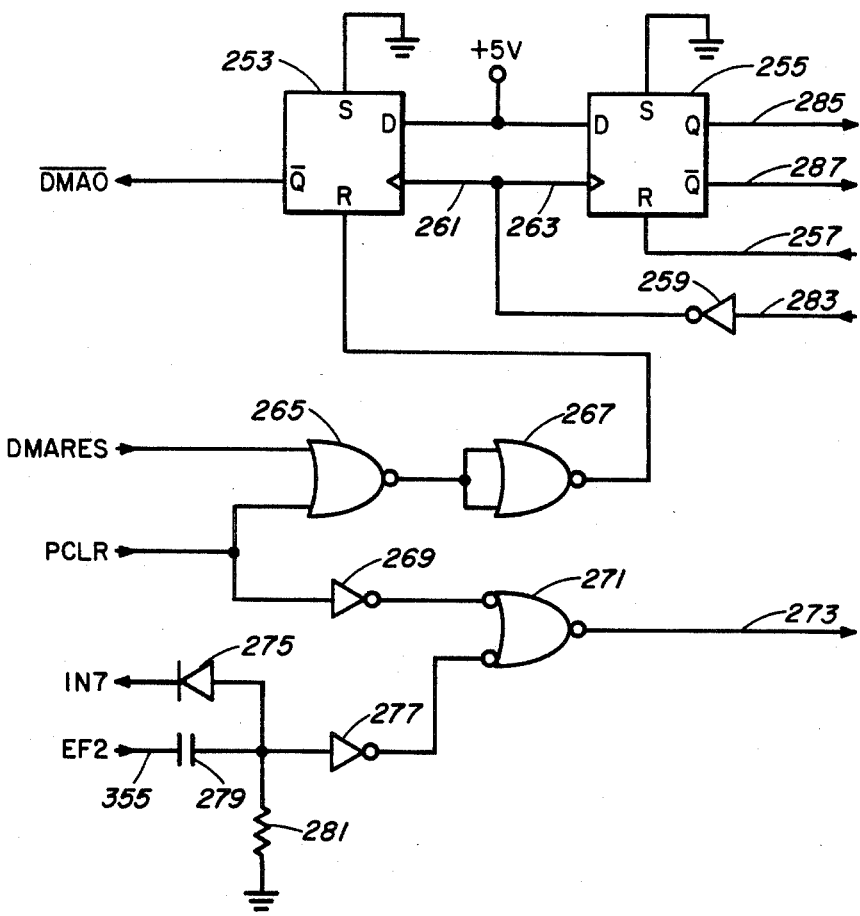
FIG. 18 is a detailed logic diagram of a data display/processor interface circuit shown in FIG. 17.

The data-display processor interface 237 provides the necessary delays, timing, and signals for proper system operation, see FIG. 18. Primary timing circuits are provided by two D flip flops, 253 and 255. A signal on line 283 is inverted by inverter 259 and fed to the input 261 of D flip flop 253 and input 263 of D flip flop 255. The $\overline{Q}$ output D flip flop 253 is the DMAO signal. The clearing signal PCLR is fed through NOR gates 265 and 267 to reset D flip flop 253. Likewise, the D flip flop 253 is also reset by the DMARES signal feeding through NOR gates 265 and 267. Further the PCLR clearing signal is fed through an inverter 269 and an inverted input NOR gate 271 to produce a clearing pulse on line 273. Other signals which produce a clearing pulse on line 273 are the INT signal which feeds through diode 275, inverter 277 and inverted input NOR gate 271. Also a pulse provided on line 273 by the EF2 signal which feeds through a capacitor 279 in combination with a resistor 281 to inverter 277 and inverted input NOR gate 271. Finally the D flip flop 255 is reset by a signal on line 257 and provides a $\overline{Q}$ output on line 285 and a $\overline{\overline{Q}}$ output on line 287.

Figure 19:
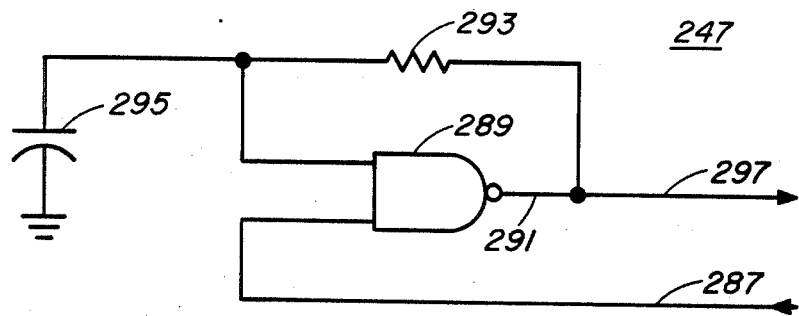
FIG. 19 is a detailed circuit diagram of a liquid crystal display clock shown in FIG. 17.

The $\overline{Q}$ output of D flip flop 255 on line 287 is fed to the liquid crystal clock circuit 247, see FIG. 19. The signal on line 287 feeds one input of an NAND gate 289 having an output 291 which is fed back through resistor 293 and a capacitor 295. The timing period of the liquid crystal display clock 247 is determined by the time constant of the resistor 293 and the capacitor 295. Suitable values for timing purposes would be a resistor 293 of approximately 150 k$\Omega$ and a capacitor 295 of approximately 100 pF. The output 291 of the NAND gate 289 is provided as alphanumeric display clocking signal on line 297.

Figure 20:
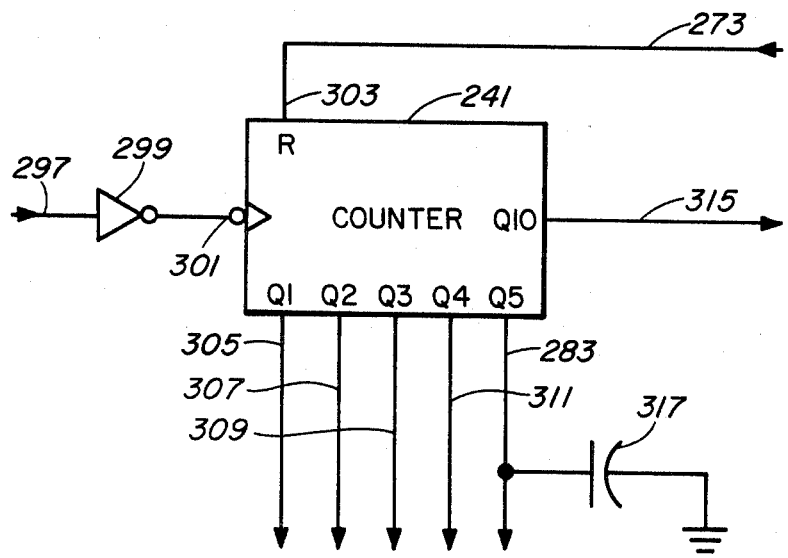
FIG. 20 is a detailed logic diagram of a counter shown in FIG. 17.

The clocking signal on line 297 is fed through inverter 299 to input 301 of counter 241, see FIG. 20. The counter 241 is a ripple carry binary counter. The counter 241 is advanced one count on each negative transition of the pulse at the input 301. The counter 241 is reset to 0 by a logical 1 at the reset input 303 fed by line 273 from the data display processor interface 237. The line 273 provides a reset upon signals from PCLR, INT, and EF2. The counter 241 is used to provide only six outputs, its first stage Q1 output on line 305, the second stage Q2 output on line 307, the Q3 output on line 309, the Q4 output on line 311, the Q5 output on line 283, and the Q10 output on line 315. To provide some pulse shaping a small capacitor 317 is provided to ground on 313. A suitable implementation for counter 241 would be the National Semiconductor CD4040BC twelve stage ripple carry binary counter.

As will be seen hereinafter, the counter output Q1, Q2, Q3, and Q4 on lines 305, 307, 309, and 311 respectively, will be compared with the data signals on lines D0 through D3. The data signals D0 through D7 are fed to a data latch 239 and outputed as signals DLQ-1 through DLQ-8 respectively, see FIG. 21. The data latch 239 is loaded by the signal DMLOAD.

Figure 21:
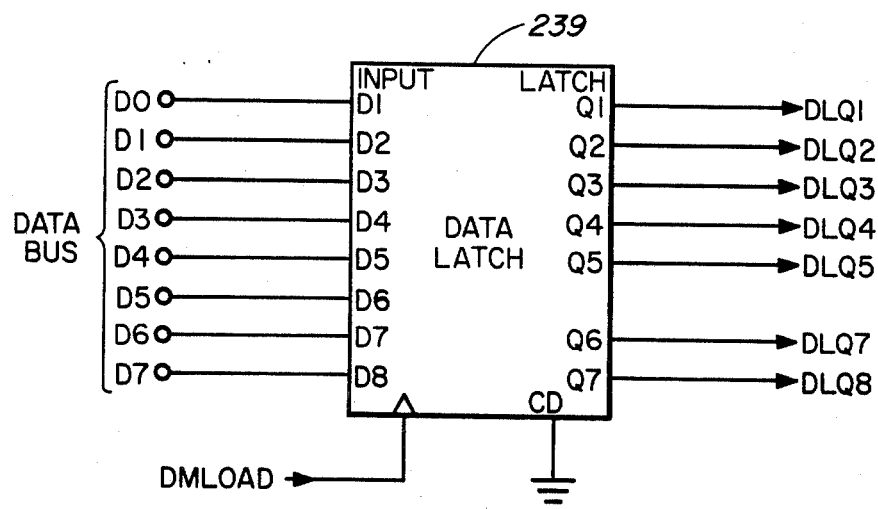
FIG. 21 is a detailed logic diagram of a data latch circuit shown in FIG. 17.

The outputs DLQ-1 through DLQ-8 respectively, see FIG. 21. The data latch 239 is loaded by the signal DMLOAD.

Figure 22:
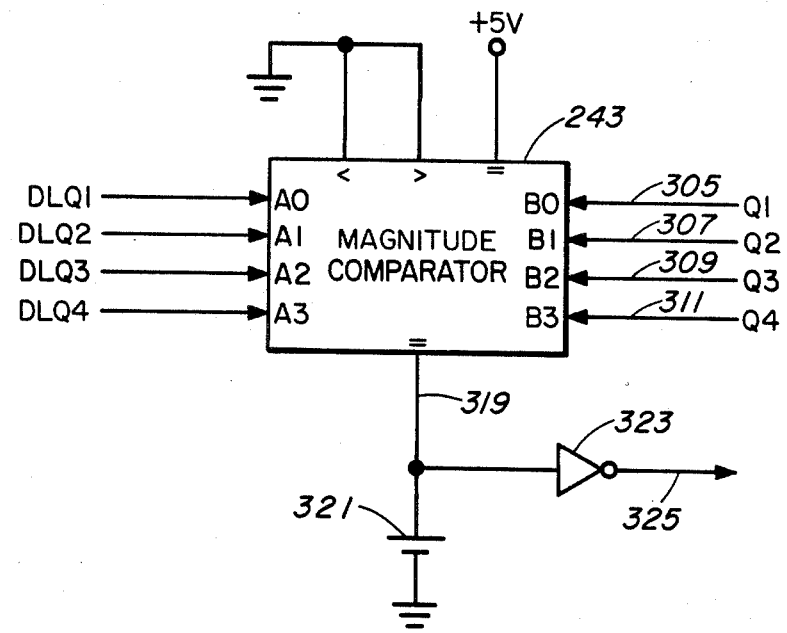
FIG. 22 is a detailed logic diagram of a magnitude comparator circuit shown in FIG. 17.

The outputs DLQ-1 through DLQ-4 of the data latch 239 which represent the latched values of the data D0 through D3 are compared in magnitude comparator 243 with the counter 241 outputs Q1 through Q4, see FIG. 22. When the compared values are equal a signal is generated on the equal output line 319 having a capacitor 321 to ground and being fed through an inverter 323 to produce a signal indicative of an equal comparison on output line 325.

Figure 23:
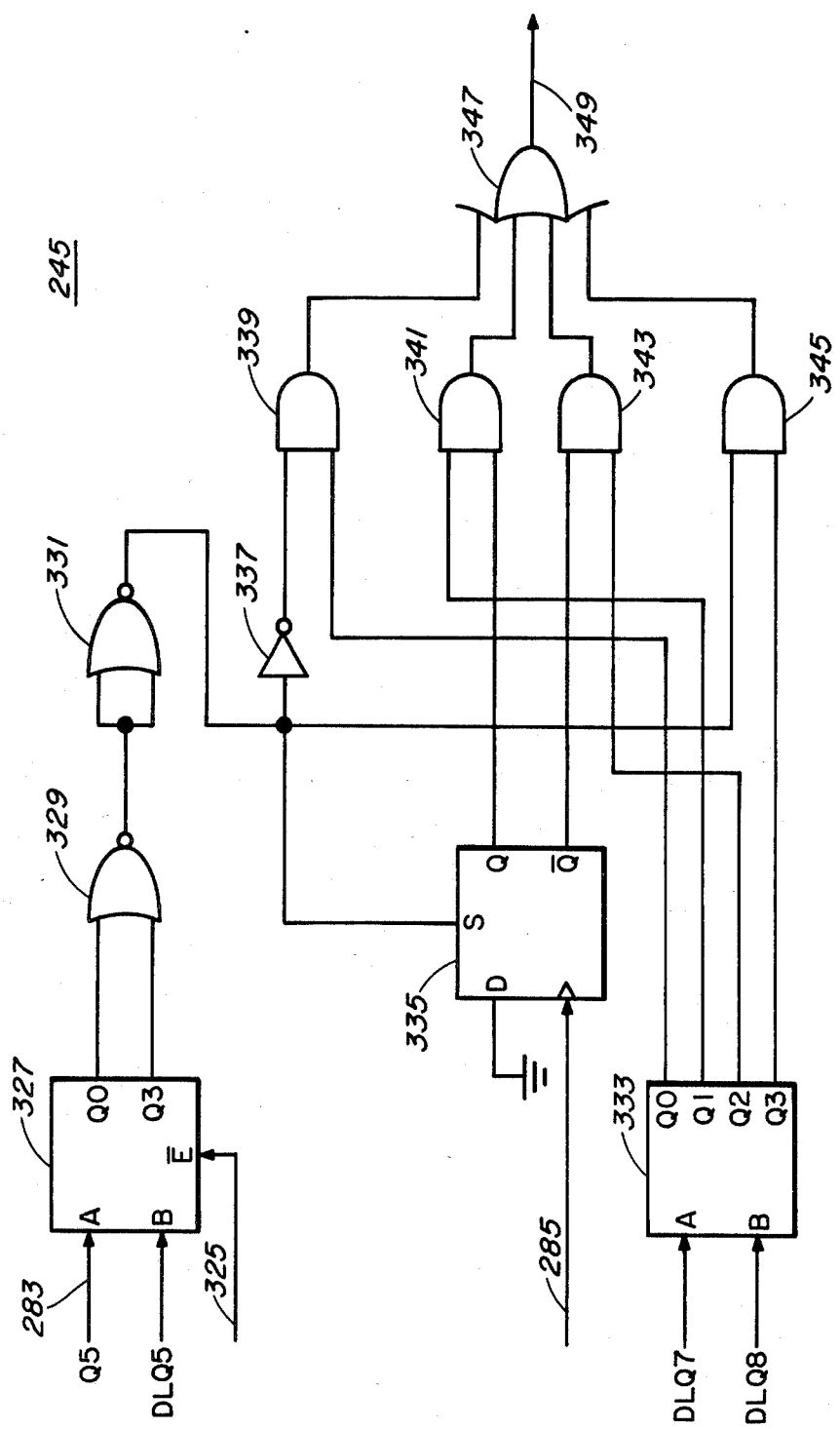
FIG. 23 is a detailed logic diagram of a display mode decode circuit shown in FIG. 17.
Figure 24:
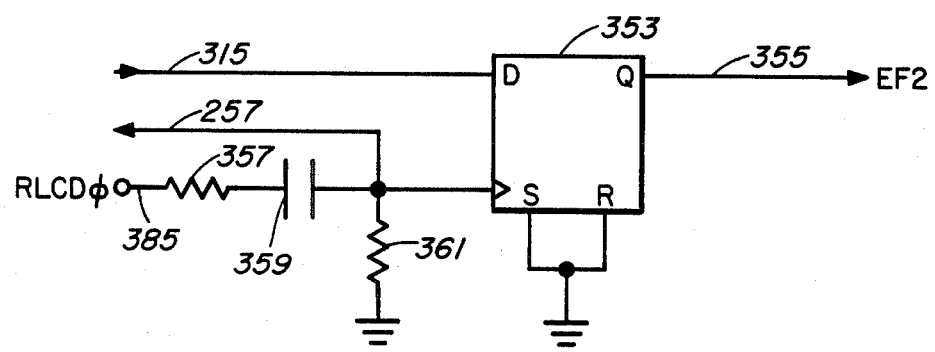
FIG. 24 is a detailed logic diagram of a row data latch circuit shown in FIG. 17.

The equal comparison signal on line 325 is used to enable binary to 1-of-4 on circuit 327 in the display mode decode circuit 245, see FIG. 23. The binary to 1-of-4 circuit 327 is utilized equivalently with NOR gates 329 and 331 as a comparator for the signal Q5 from counter 241 fed on line 283 and DLQ-5 output of delay latch 239. A binary to 1-of-4 circuit 333 is used to convert the binary signal on the delay latch 239 output at DLQ-7 and DLQ-8 into four signals Q0 through Q3 of binary to 1-of-4 circuit 333. The output on line 285 from the data display processor interface circuit 237 clocks D flip flip 335. The above circuitry in conjunction with inverter 337, NAND gates 339, 341, 343, 345, and OR gate 347, produces an output on line 349 which fed through the level shifter 251 to generate column data 351.

The row data latch circuit 249 is primarily a D flip flop 353 which generates on line 355 the flag EF2. Q10 from the counter 241 provides the data input on line 315 to the D flip flop 353. An RLCD0 signal from matrix display driver 231 provides the clocking for D flip flop 353 through a combination of resistor 357, capacitor 359, and resistor 361. Outputted on line 254 is the clocking signal to reset D flip flop 255 in the data display processor interface 237.

Figure 25:
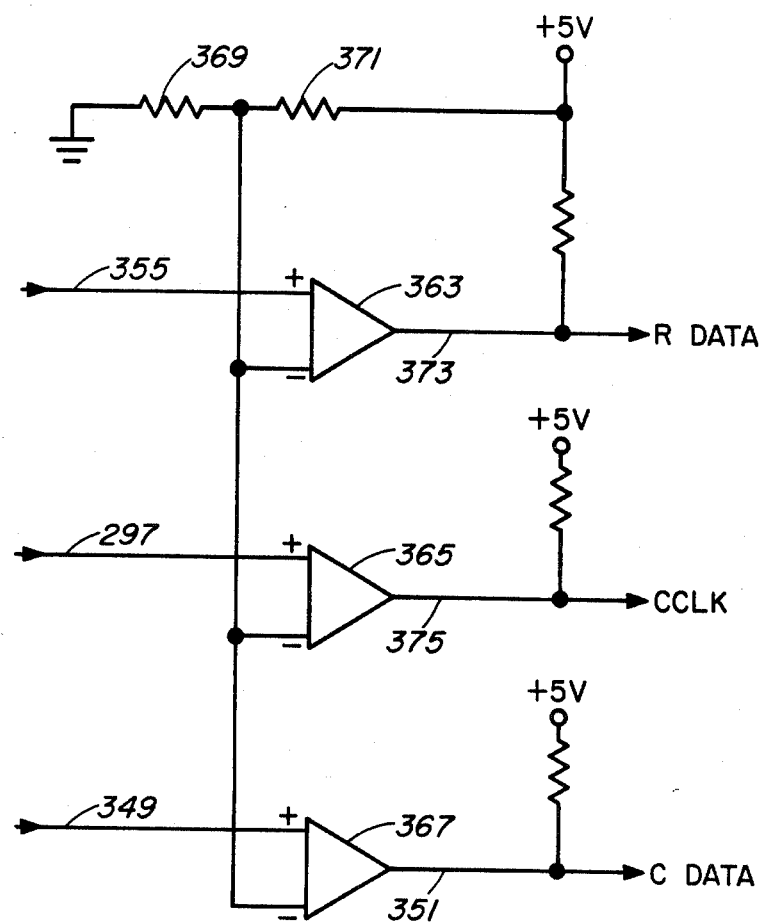
FIG. 25 is a detailed circuit diagram of a level shifting circuit shown in FIG. 17.

The output on line 355, EF2, drives a differential amplifier 363 in the level shift circuit 251, see FIG. 25. Likewise, the signal output on line 297 from the LCD drive circuit 247 drives amplifier 365 and the output 349 from the display mode decode circuit 245 drives amplifier 367. Two bias resistors 369 and 371 provide a off-set signal on output 373 of amplifier 363, on output 375 of amplifier 365 and on output 351 of amplifier 367.

Figure 26:
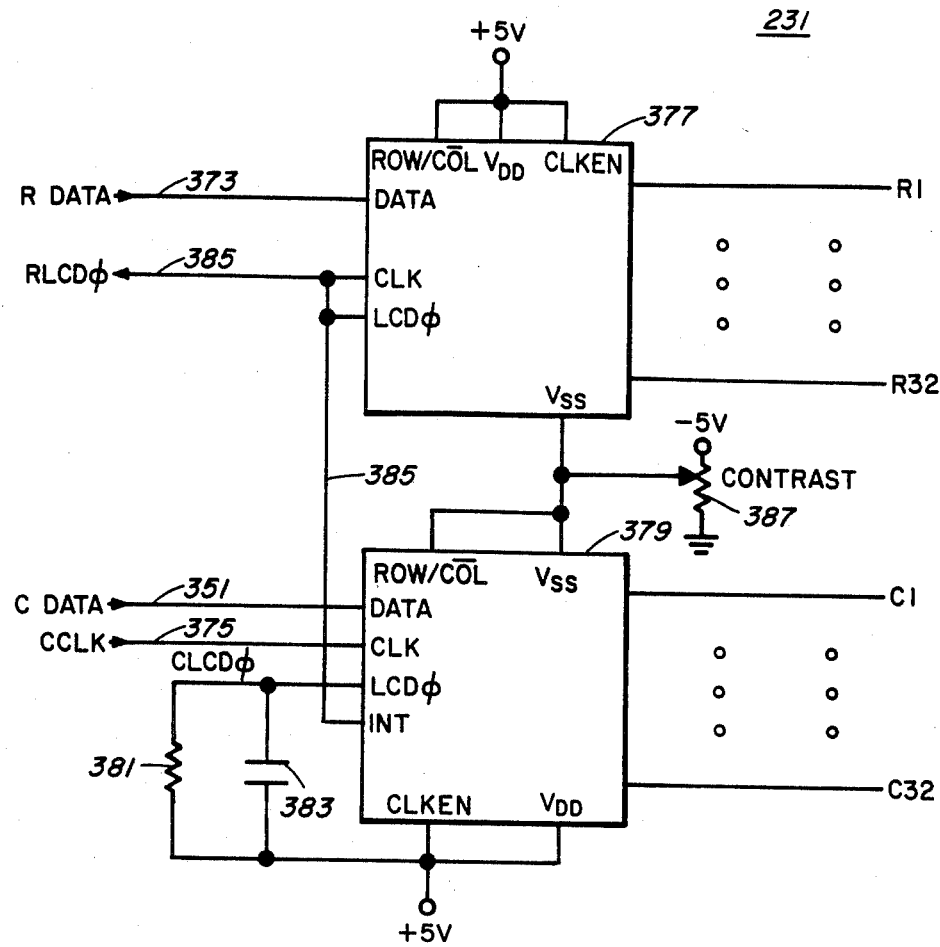
FIG. 26 is a detailed logic diagram of a data matrix display logic circuit shown in FIG. 1.

With brief reference again to FIG. 1, it can be seen that the matrix display driver 231 follows the data matrix display logic 229. The matrix display drive 231 has as it main elements two serial input dot matrix LCD drivers, row driver 377, and column driver 379, see FIG. 26. The role driver 377 and the column driver 379 each can be implemented on a single chip such as the serial input dot matrix LCD driver chip HLCD0540 available from Hughes Corporation. Clocking for both the row driver 377 and the column driver 379 is derived from an RC time constant of resistor 381 on the order of 1 M$\emptyset$ and capacitor 383 on the order of 1500 pF. The clocking output from the column driver 379 is provided on the INT line 385 to the row driver 377 and outputted to other circuits under the designation RLCD0. The column driver 379 receives column data on C DATA line 351 as clocked by the C CLK line 375. Data is outputed on 32 lines designated C1 through C32. The row driver 377 receives row data on line 373 and outputs 32 lines of row data designated R1 through R32. Further, the intensity of a row and column displays may be set or varied by contrast potentiometer 387.

Figure 27:
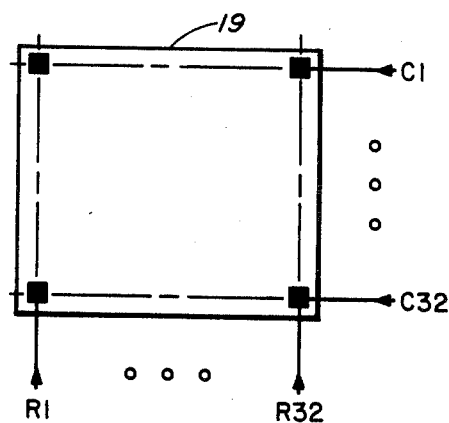
FIG. 27 is a detailed illustration of a data matrix display circuit shown in FIG. 1.

The row driver 377 and the column driver 379 drive a 32×32 dot matrix liquid crystal display 19, see FIG. 27. The column inputs C1 through C32 are provided from the column driver 379 and the row inputs R1 through R32 are provided by the row driver 377. Suitable implementation for the 32×32 dot matrix display 19 is the Cockroft International display model C11-101M.

Since the data memory 135 stores 128 channels of data and the matrix display 19 can display only 32 channels at one time, data scaling as selected by the control keyboard 33 is employed to permit the operator to view 16, 32, 64 or 128 channels. In each case the CPU and control logic 127 averages events in a block of data channels to give an accurate spectrum on the matrix display 19. Further, the control keyboard 33 functions to enable the operator to view a 32 channel block of data stored anywhere in the data memory 135.

The data memory 135 stores 16 bits of data for each of 128 channel data blocks. Thus 65536 events can be stored in each channel. Since the matrix display 19 is only 32 units high the data is scaled to fit the display. For vertical scaling the processor 131 divides the data by a number selected by the operator on keyboard 33. The divisor can be the number 2 raised to any power between 0 and 12. In FIG. 2 data is shown being displayed as a black-on-white bar graph. The operator can also select to display the data as a white-on-black bar graph, a black-on-white line graph in which only the maximum value dot in each channel is black, and a white-on-black line graph.

Figure 28:
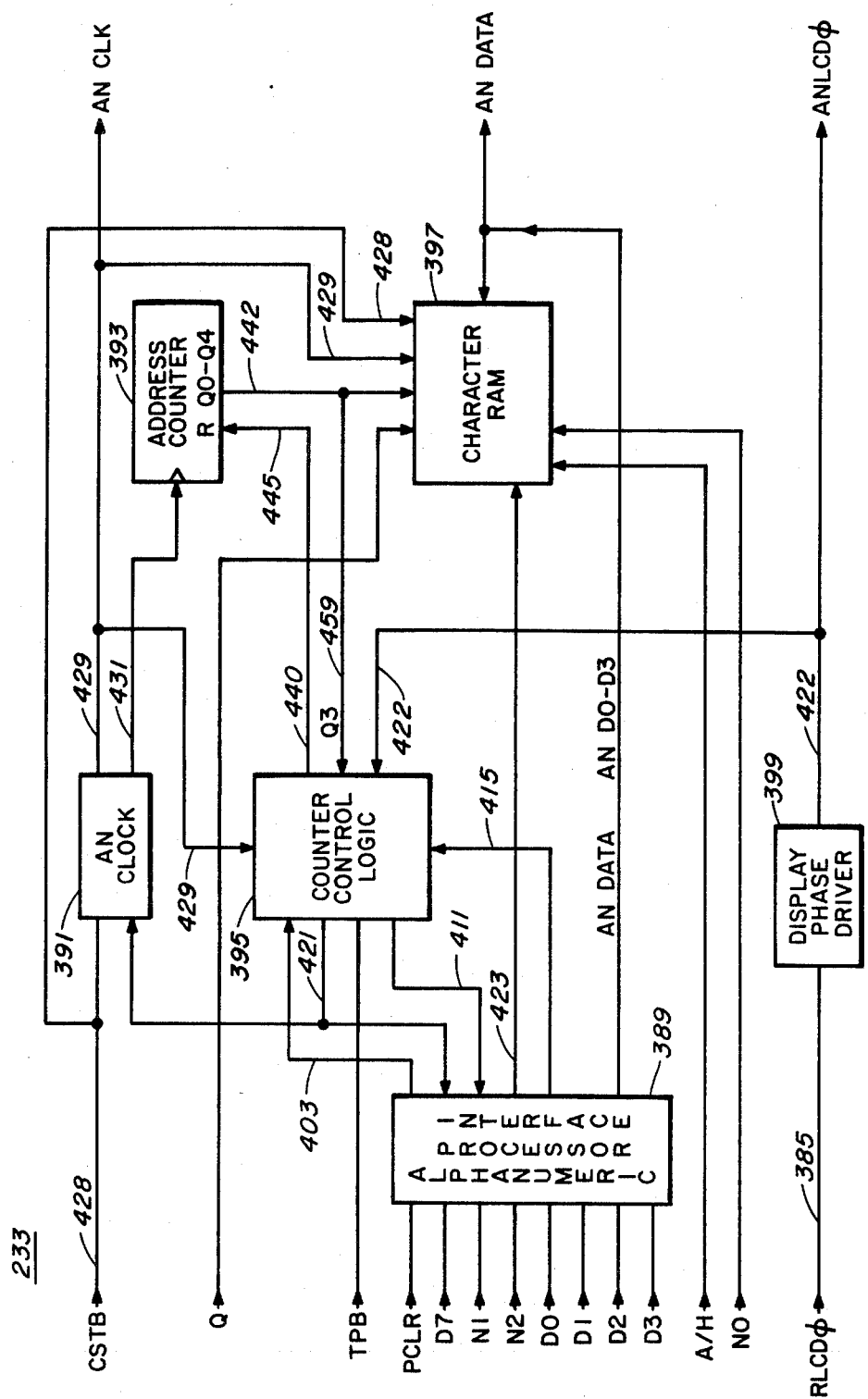
FIG. 28 is a detailed block diagram of an alphanumeric display logic circuit shown in FIG. 1.

With brief reference again to FIG. 1, it's appreciated that the scaling and type of data being displayed on data matrix display 19 is indicated on alphanumeric display 21. The alphanumeric display 21 is driven by the alphanumeric display driver 235 which in turn is controlled by the alphanumeric display logic 233. The alphanumeric display logic 233 derives its inputs from the control section 15. The alphanumeric-display logic 233 comprises as its main elements the alphanumeric-processor interface 389, the alphanumeric clock circuit 391, the alphanumeric address counter 393, the counter control logic 395, the character random access memory 397, and the display phase driver 399, see FIG. 28.

Figure 29:
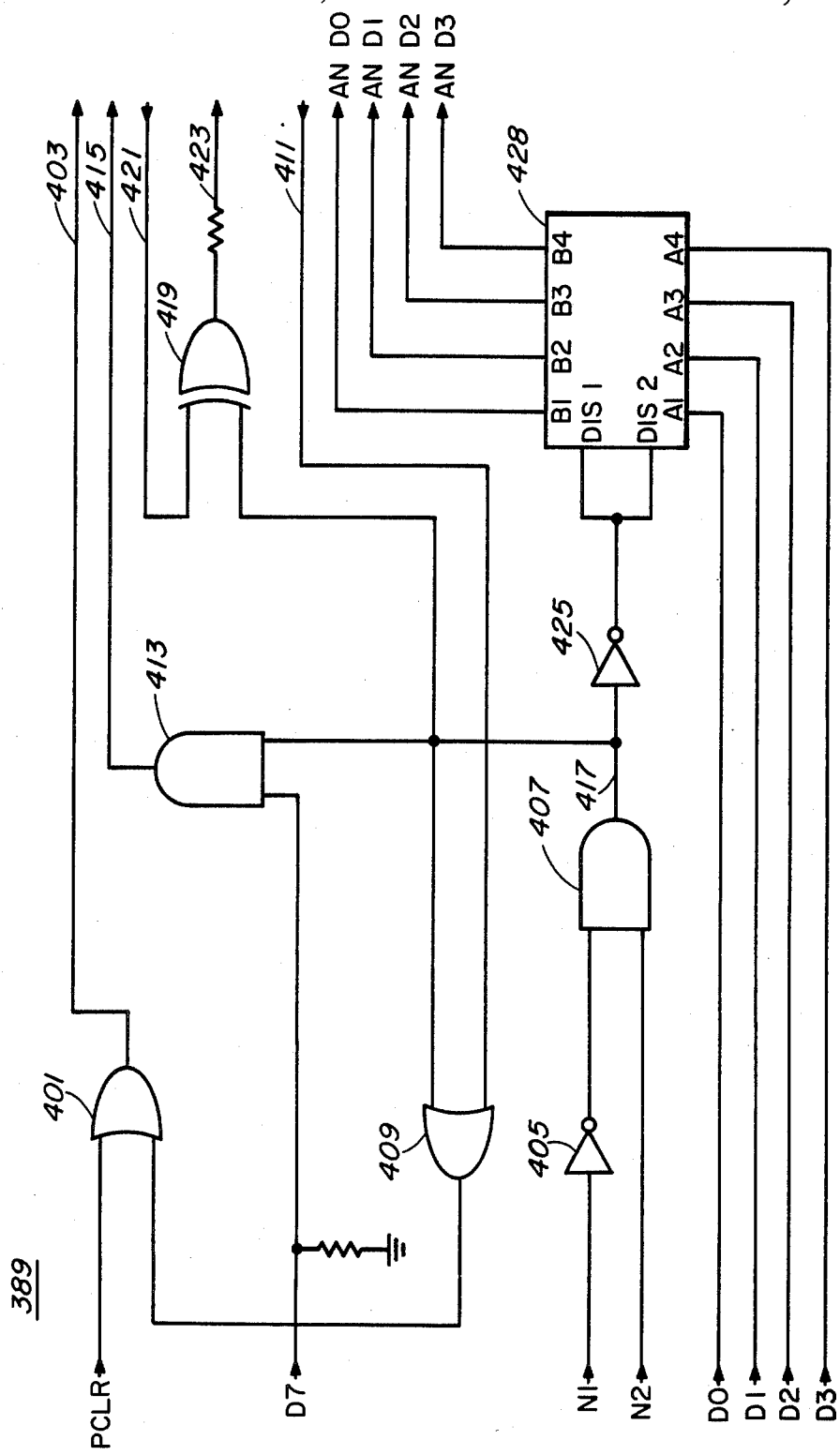
FIG. 29 is a detailed logic diagram of an alphanumeric/processor interface circuit shown in FIG. 28.

The alphanumeric-processor interface circuit 389 provides necessary logic and buffering circuits, see FIG. 29. The clearing signal PCLR is fed through OR gate 401 to produce an output on reset line 403. Likewise, the control signals N1 and N2 operating in conjunction with inverter 405, AND gate 407, OR gate 409, and OR gate 401 also produce a reset signal on reset line 403. The signal level on reset line 403 is also effected by an input signal on line 411 feeding OR gate 409. Likewise, the data signal D7 is fed through AND gate 413 to produce an output on a line 415. The output on line 415 is also affected by the control signal N1 and N2 functioning through inverter 405, AND gate 407, and AND gate 413. The control signals N1 and N2 also function through inverter 405 and AND gate 407 to produce an input on first input line 417 of OR gate 419 which has another input 421 and an output 423. The signal on line 417 is also fed through inverter 425 to effect the enabling and disabling of hex-buffer 427 which has inputs the data D0 through D3 and as outputs the alphanumeric data AND0 through AND3 which is merely a buffered representation of the inputs D0 through D3. A suitable implementation for the hex-buffer 427 is the National Semiconductor hex-buffer MM80C97.

Figure 30:
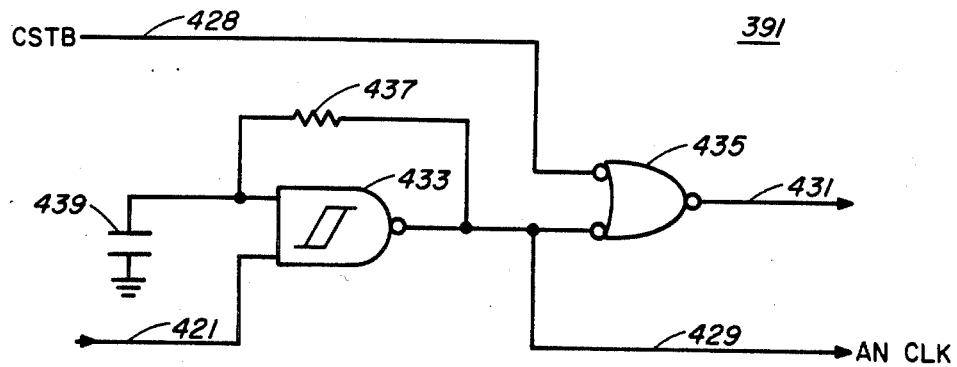
FIG. 30 is a detailed circuit diagram of an alphanumeric clock circuit shown in FIG. 28.

The alphanumeric clock 391 receives the $\overline{CSTB}$ signal on line 428 and outputs a clock pulse on the AN clock pulse line 429, see FIG. 30. Also, a signal is provided on line 431 to provide an input to address counter 393. The alphanumeric clock circuit 391 has as active elements a Schmitt trigger 433 and an inverted input NOR gate 435. Timing is provided by resistor 437 in the order of 33k$\omega$ and capacitor 439 in order of 0.01 $\mu$F.

Figure 31:
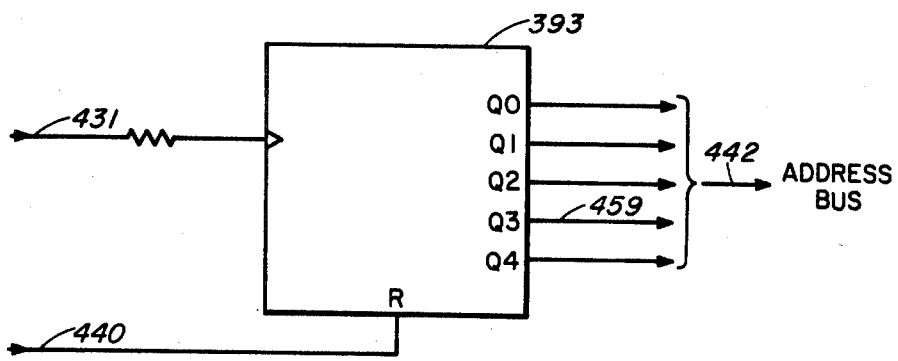
FIG. 31 is a detailed logic diagram of an address counter circuit shown in FIG. 28.

The alphanumeric clock 391 output on line 431 is used as a clocking input to address counter 393, see FIG. 31. The address counter 393 is reset by a signal on line 440 and outputs binary signals Q0 through Q4 on address bus 442.

Figure 32:
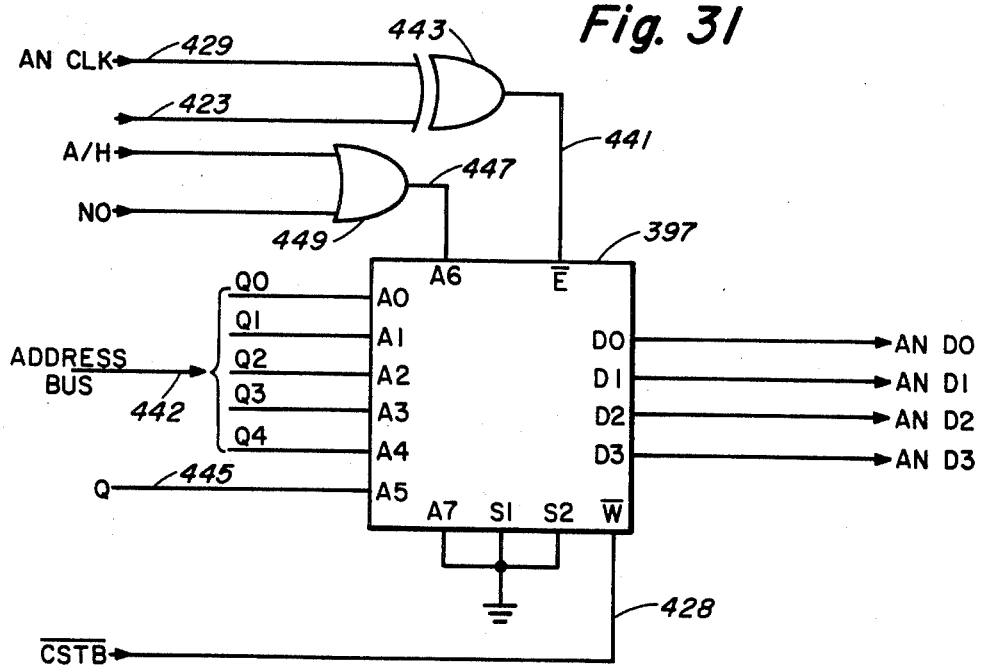
FIG. 32 is a detailed logic diagram of a character RAM shown in FIG. 28.

The signals Q0 through Q4 from counter 393 are fed on address bus 442 as addresses as A0 through A4 respectively to character RAM 397, see FIG. 32. The enable input 441 of the character RAM 397 is controlled by the output of the exclusive OR circuit 443 which has as inputs the alphanumeric clock signal on line 429 and a signal on 423 provided by the alphanumeric processor interface 389. A fifth address is provided by the signal Q on line 445 while a sixth address is provided on a line 447 as the output of OR gate 449 having as inputs the A/H signal and the N0 signal. The character RAM 397 outputs the alphanumeric data signals AN D0 through AN D3. Finally, the write control on input 428 is provided by the $\overline{CSTB}$ signal. A suitable candidate for the 265×4 RAM 397 is the IM6561.

Figure 33:
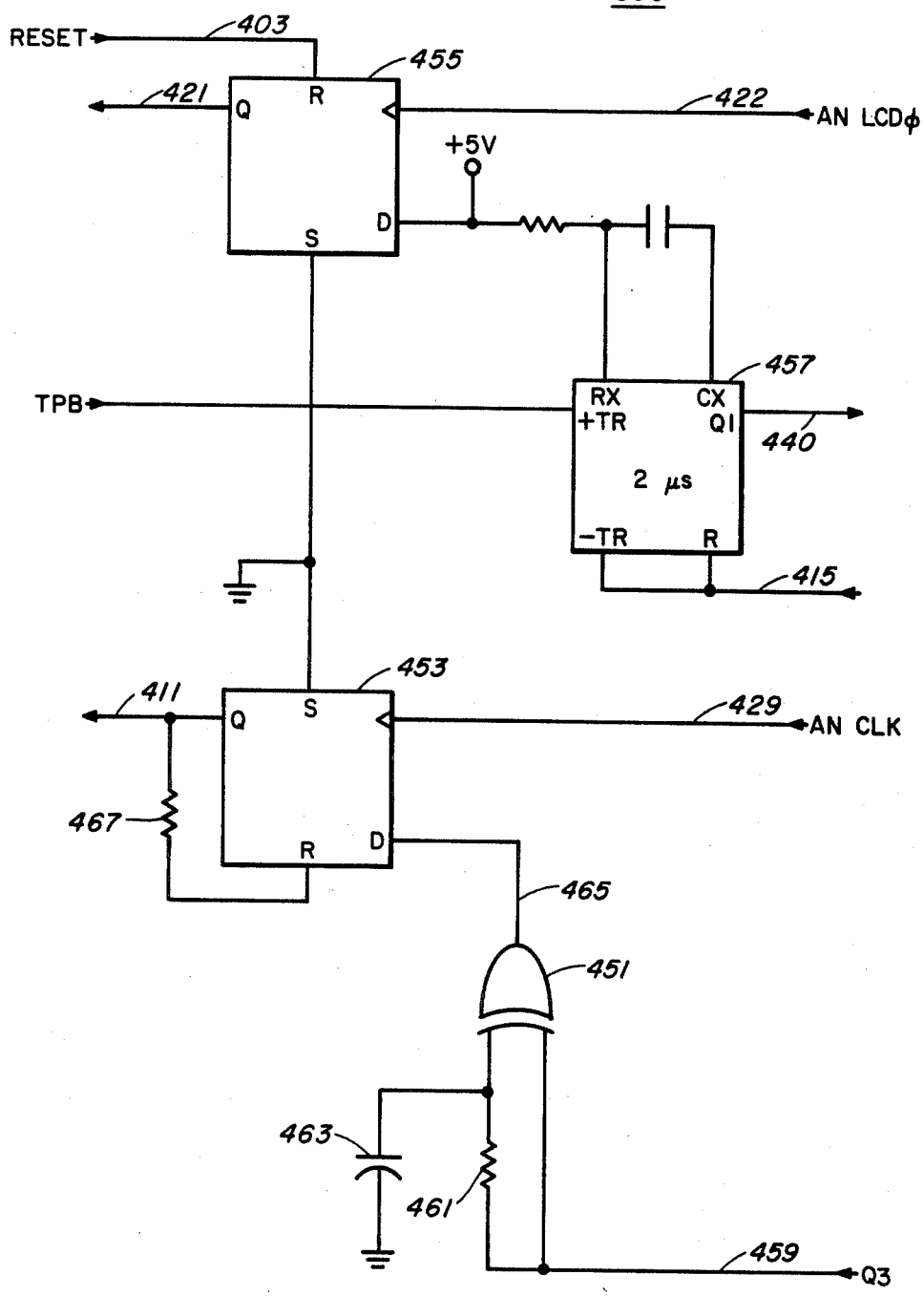
FIG. 33 is a detailed circuit diagram of a counter control logic circuit shown in FIG. 28.

With reference to FIG. 33, the counter control logic 395 comprises as active elements exclusive OR gate 451, a D flip flop 453, a second D flip flop 455 and a two microsecond monostable multivibrator 457. The exclusive OR circuit 451 is fed by the Q3 address output of address counter 393 on line 459. A slight delay is incorporated by the inclusion of resistor 461 and capacitor 463. The output 465 of the exclusive OR 451 provides the data input to D flip flop 453. The D flip flop 453 is triggered by the alphanumeric clock signal on line 429 and has its Q output on line 411 feeding to an OR gate 409 in the alphanumeric processor interface 389. A resistor 467 is coupled back between the Q output of D flip flop 453 and its reset input R. The D flip flop 455 is clocked by the AN LCD∅ input on line 422 and has its Q output 421 feeding the Schmitt trigger 433 in the alphanumeric clock circuit 391. The D flip flop 455 is reset on line 403 by the reset output of OR gate 401 in the alphanumeric-processor interface circuit 389. The two-microsecond monostable multivibrator 457 is triggered by signal TPB and reset by a signal on line 415 from an AND gate 413 in the alphanumeric-processor interface circuit 389. The two-microsecond monostable multivibrator 457 has its output on line 440 feeding the reset of the address counter 393.

Figure 34:
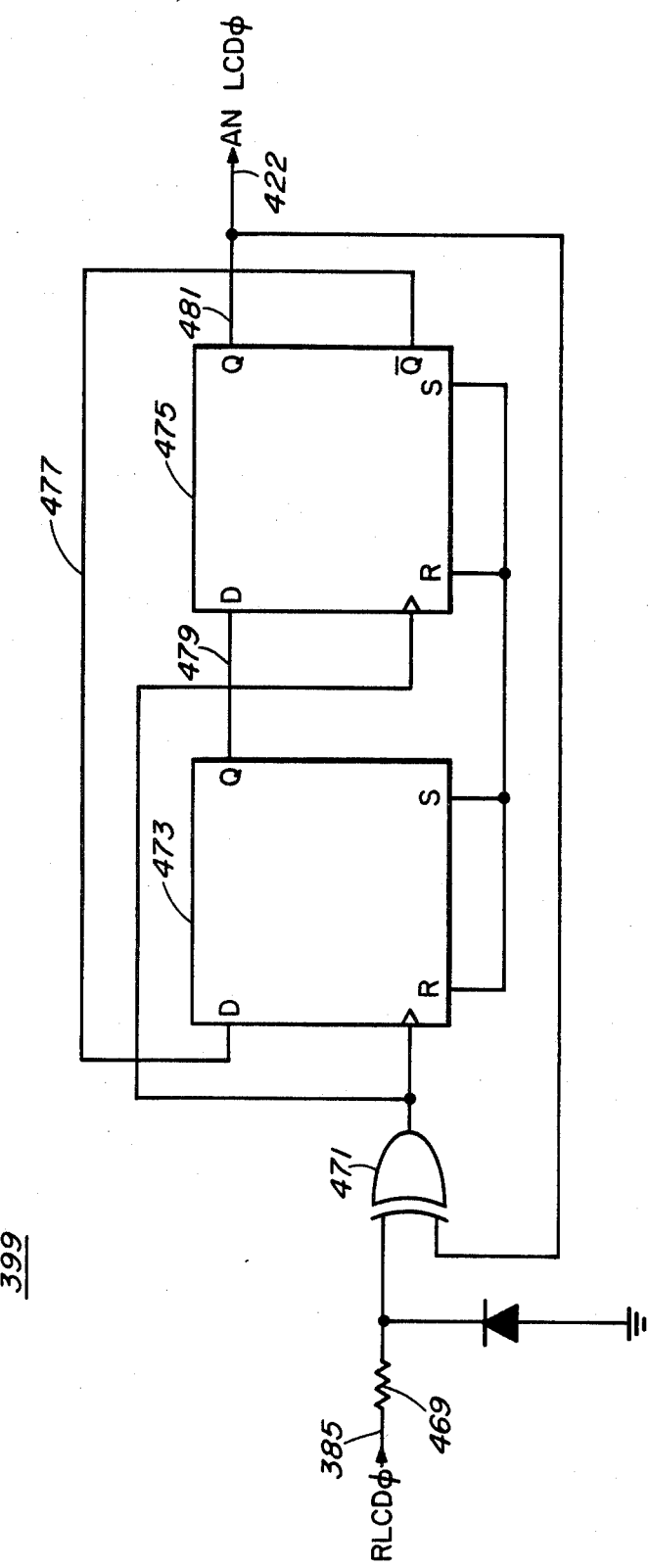
FIG. 34 is a detailed logic diagram of a display phase driver shown in FIG. 28.

The display phase driver 399 is driven by the RLCD∅ signal on line 385, see FIG. 34. The RLCD∅ signal on line 385 is outputted from the data matrix row driver 377 (see FIG. 26). The RLCD∅ signal on line 385 passes through a resistor 469 to exclusive OR circuit 471. The exclusive OR circuit 471 triggers D flip flop 473 and also D flip flop 475. The data input for the D flip flip 473 is provided by the $\overline{Q}$ output of D flip flop 475 on line 477. The data input for D flip flop 475 is provided by the Q output of D flip flop 473 on line 479. The D flip flop 475 Q output on line 481 is fed back to the exclusive OR circuit 471 and is also outputted as the a LCD∅ signal on line 422.

Figure 35:
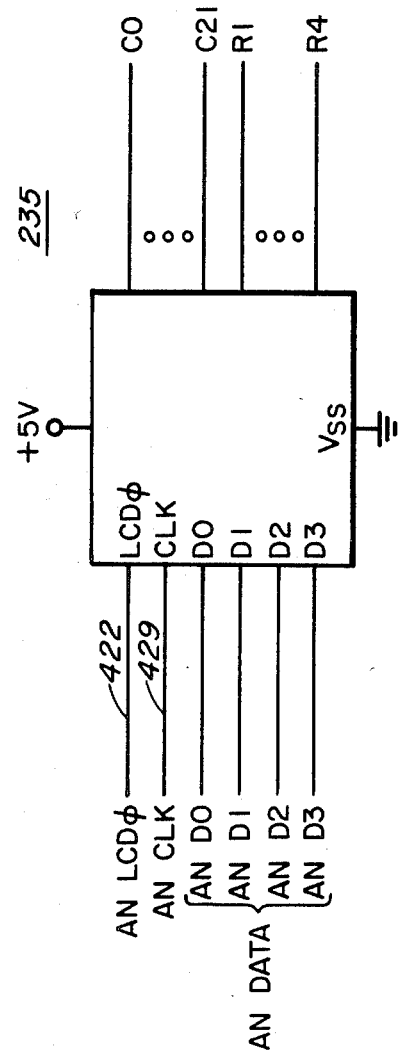
FIG. 35 is a detailed diagram of an alphanumeric display driver shown in FIG. 1.

The AN LCD∅ signal on line 422 is fed to the alphanumeric display driver 235, see FIG. 35. Also supplied to the alphanumeric display driver 235 is the ANCLK signal on line 429 as generated by the alphanumeric clock circuit 391. Finally the four data signals, AN DO through AN D3 as outputted by the alphanumeric-processor interface 389 and the character RAM 397 are provided to the alphanumeric display driver 235. The alphanumeric display driver 235 outputs 22 column signals designated C0 through C21 and four row signals designated R0 through R3. Although not limited thereto, a suitable implementation for the alphanumeric display driver 235 would be the Hughes Company parallel input dot matrix LCD driver HLCD0541.

Figure 36:
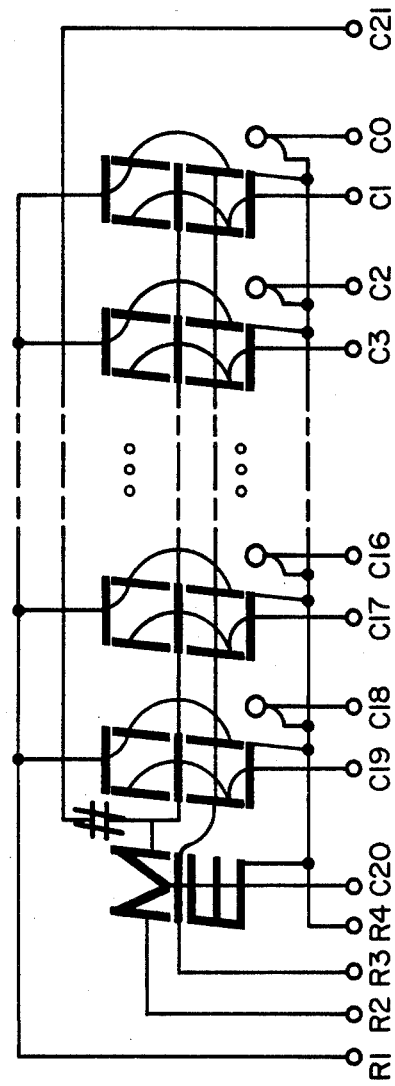
FIG. 36 is a detailed illustration of an alphanumeric display shown in FIG. 1.

The alphanumeric display driver 235 drives in alphanumeric display 21, see FIG. 36. Although not limited thereto, a suitable implementation for the alphanumeric display 21 would be the EPSON liquid crystal display LD-402. Preferably, the alphanumeric display 21, to aid in spectrum analysis, is a ten-character liquid crystal display. The alphanumeric display 21 functions in either the Acquire mode or the Hold mode. In the Acquire mode, vertical and horizontal scale factors are displayed. In the Hold modes, the cursor channel number and the number of events in the cursor channel are displayed.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A hand-holdable battery-operated spectrometer gun comprising:
a barrel portion;
a main body portion;
a handle portion;
detection means housed in said barrel portion for detecting a signal from a source and for generating an electrical output signal representative thereof;
signal processing means housed in said main body portion for amplifying and shaping said electrical output signal of said detection means and for generating a digitized signal representative of said amplified and shaped electrical output signal;
control means housed in said main body portion for digitally processing and storing said digitized signal generated by said signal processing means and for controlling a display thereof;
display means housed in said main body portion for displaying said digitally processed and stored digitized signal of said control means, said display thereof being controlled by said control means; and
battery means for powering said detection means, said signal processing means, said control means, and said display means, said battery means including a battery source housed in said handle portion, a high voltage converter housed in said barrel portion powered by said battery source for powering said detection means, and a low voltage converter housed in said main body portion for powering said signal processing means, said control means, and said display means.

2. The invention according to claim 1 wherein said battery source is a rechargeable Ni-Cd battery source comprising four AA size Ni-Cd batteries.

3. The invention according to claim 1 wherein said detector means includes in combination a gamma ray detector driving a phototube.

4. The invention according to claim 3 wherein said gamma ray detector is a NaI(T1) crystal type detector.

5. The invention according to claim 3 wherein said gamma ray detector is a cadmium telluride type detector.

* * * * *